US012677467B2

(12) United States Patent
Lim et al.

(10) Patent No.: US 12,677,467 B2
(45) Date of Patent: Jul. 7, 2026

(54) SEMICONDUCTOR DEVICE INCLUDING FIN FIELD-EFFECT TRANSISTORS ON ACTIVE FINS WITH DIFFERENT GATE WIDTH IN BOUNDARY REGION

(71) Applicant: SAMSUNG ELECTRONICS CO., LTD., Suwon-si (KR)

(72) Inventors: Jaehyun Lim, Suwon-si (KR); Subin Kim, Suwon-si (KR); Jiwon Oh, Suwon-si (KR); Jinho Park, Suwon-si (KR); Joongwon Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 404 days.

(21) Appl. No.: 18/219,232

(22) Filed: Jul. 7, 2023

(65) Prior Publication Data

US 2024/0096991 A1     Mar. 21, 2024

(30) Foreign Application Priority Data

Sep. 20, 2022     (KR) ......................... 10-2022-0118265

(51) Int. Cl.
| | |
|---|---|
| H10D 64/27 | (2025.01) |
| H10D 30/43 | (2025.01) |
| H10D 30/67 | (2025.01) |
| H10D 62/10 | (2025.01) |
| H10D 84/83 | (2025.01) |

(52) U.S. Cl.
CPC ........... H10D 64/518 (2025.01); H10D 30/43 (2025.01); H10D 30/6735 (2025.01); H10D 62/121 (2025.01); H10D 84/83 (2025.01); H10D 84/834 (2025.01)

(58) Field of Classification Search
CPC .. H10D 84/834; H10D 84/83; H10D 30/6735; H10D 64/518; H10D 30/43; H10D 62/121; H10D 30/62; H10D 64/519
See application file for complete search history.

(56) References Cited

U.S. PATENT DOCUMENTS

| | | | |
|---|---|---|---|
| 8,022,478 | B2 | 9/2011 | Anderson et al. |
| 9,362,181 | B1 | 6/2016 | Xie et al. |

(Continued)

OTHER PUBLICATIONS

Extended European search report dated Feb. 6, 2024, issued from the European Patent Office for corresponding European Patent Application No. 23192940.7.

*Primary Examiner* — Changhyun Yi
(74) *Attorney, Agent, or Firm* — Muir Patent Law, PLLC

(57) ABSTRACT

A semiconductor device includes a substrate including first and second regions; a first active fin extending in a first direction on the first region; a second active fin extending in the first direction on the second region; an isolation pattern on the substrate between the first and second regions; a first gate structure on the first active fin, extending in a second direction perpendicular to the first direction, and onto an upper surface of the isolation pattern; and a second gate structure on the second active fin, extending in the second direction, and onto the upper surface of the isolation pattern, wherein the first gate structure includes a first portion having a first width and a second portion having a second width that is less than the first width, and the second gate structure includes a third portion having the first width and a fourth portion having the second width.

20 Claims, 26 Drawing Sheets

(56) References Cited

U.S. PATENT DOCUMENTS

| | | | |
|---|---|---|---|
| 9,634,138 B1 | 4/2017 | Choi et al. | |
| 9,881,842 B1 | 1/2018 | Chung et al. | |
| 9,978,745 B2 | 5/2018 | Wang et al. | |
| 10,276,567 B2 | 4/2019 | Kim et al. | |
| 10,417,369 B2 | 9/2019 | Chen et al. | |
| 10,741,659 B2 | 8/2020 | Yoon et al. | |
| 2019/0221564 A1* | 7/2019 | Kim | H10D 30/6217 |
| 2020/0295051 A1 | 9/2020 | Chang et al. | |
| 2021/0020644 A1* | 1/2021 | Paul | H01L 21/28088 |
| 2021/0305429 A1 | 9/2021 | Choi et al. | |
| 2022/0102359 A1 | 3/2022 | Su et al. | |

* cited by examiner

SECOND
DIRECTION

FIRST
DIRECTION

SECOND
DIRECTION

FIRST
DIRECTION

FIG. 7

SECOND
DIRECTION

FIRST
DIRECTION

FIG. 9

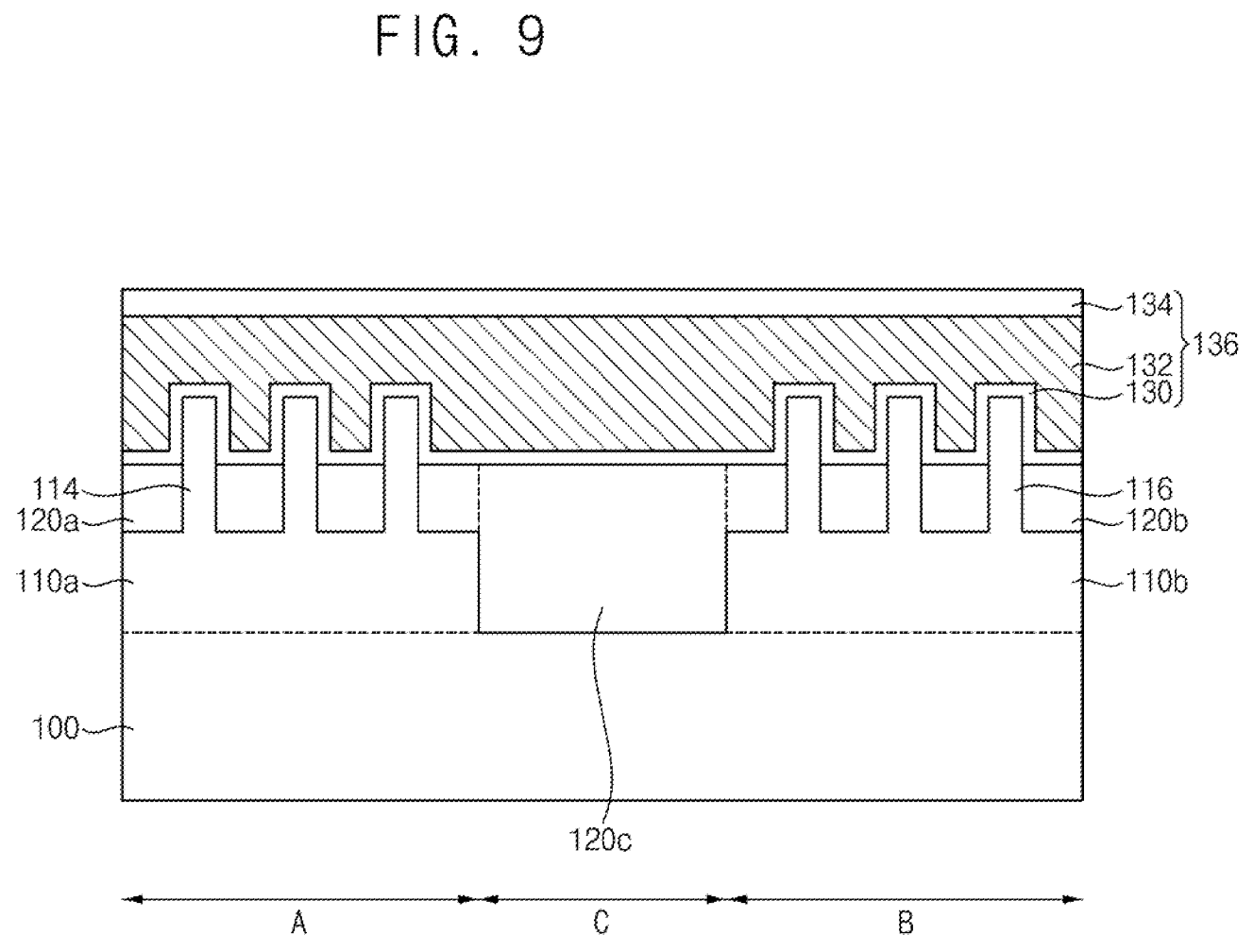

SECOND
DIRECTION

FIRST
DIRECTION

FIG. 12

SECOND
DIRECTION

FIRST
DIRECTION

SECOND
DIRECTION

FIRST
DIRECTION

SECOND
DIRECTION

FIRST
DIRECTION

SECOND
DIRECTION

FIRST
DIRECTION

SECOND
DIRECTION

FIRST
DIRECTION

SECOND
DIRECTION

FIRST
DIRECTION

SECOND
DIRECTION

FIRST
DIRECTION

SEMICONDUCTOR DEVICE INCLUDING FIN FIELD-EFFECT TRANSISTORS ON ACTIVE FINS WITH DIFFERENT GATE WIDTH IN BOUNDARY REGION

CROSS-REFERENCE TO RELATED APPLICATION

This application claims priority under 35 USC § 119 to Korean Patent Application No. 10-2022-0118265, filed on Sep. 20, 2022, in the Korean Intellectual Property Office (KIPO), the contents of which are incorporated by reference herein in their entirety.

BACKGROUND

1. Field

Embodiments relate to a semiconductor device.

2. Description of the Related Art

A semiconductor device may include field effect transistors (FETs).

SUMMARY

The embodiments may be realized by providing a semiconductor device including a substrate including a first region and a second region; a first active fin extending in a first direction on the first region of the substrate; a second active fin extending in the first direction on the second region of the substrate; an isolation pattern on the substrate between the first region and the second region; a first gate structure on the first active fin, the first gate structure extending in a second direction perpendicular to the first direction, and the first gate structure extending onto an upper surface of the isolation pattern; and a second gate structure on the second active fin, the second gate structure extending in the second direction, and the second gate structure extending onto the upper surface of the isolation pattern, wherein the first gate structure includes a first portion having a first width and a second portion having a second width that is less than the first width, and wherein the second gate structure includes a third portion having the first width and a fourth portion having the second width.

The embodiments may be realized by providing a semiconductor device including a substrate including a first region, a second region, and a boundary region between the first region and the second region; first active fins on the first region of the substrate, the first active fins extending in a first direction; second active fins on the second region of the substrate, the second active fins extending in the first direction; an isolation pattern on the boundary region of the substrate; first gate structures on the first active fins, the first gate structures extending in a second direction perpendicular to the first direction, and the first gate structures extending onto an upper surface of the isolation pattern; second gate structures on the second active fins, the second gate structures extending in the second direction, and the second gate structures extending onto the upper surface of the isolation pattern; a first semiconductor structure on the first active fins adjacent to both sides of the first gate structure; a first metal pattern extending in the second direction, the first metal pattern contacting the first semiconductor structure; a second semiconductor structure on the second active fins adjacent to both sides of the second gate structure; and a second metal pattern extending in the second direction, the second metal pattern contacting the second semiconductor structure, wherein a portion of the first gate structure on the isolation pattern has a width that is less than a width of other portions of the first gate structure, and wherein a portion of the second gate structure on the isolation pattern has a width that is less than a width of other portions of the second gate structure.

The embodiments may be realized by providing a semiconductor device including a substrate including a first region, a second region, and a boundary region between the first region and the second region; an isolation pattern on the boundary region of the substrate; a first gate structure on the first region of the substrate, the first gate structure extending in a second direction, and one end of the first gate structure being on the isolation pattern of the boundary region adjacent to the first region; and a second gate structure on the second region of the substrate, the second gate structure extending in the second direction, and one end of the second gate structure being on the isolation pattern of a boundary region adjacent to the second region, wherein the first gate structure includes a first portion having a first width and a second portion having a second width that is less than the first width, the second portion being on the isolation pattern, and wherein the second gate structure includes a third portion having the first width and a fourth portion having the second width, the fourth portion being on the isolation pattern.

BRIEF DESCRIPTION OF THE DRAWINGS

Features will be apparent to those of skill in the art by describing in detail exemplary embodiments with reference to the attached drawings in which:

FIGS. 6 to 16 are plan views and cross-sectional views of stages in a method of manufacturing a semiconductor device in accordance with example embodiments.

FIG. 18 is a cross-sectional view of a semiconductor device in accordance with example embodiments.

DETAILED DESCRIPTION

Figure 1:
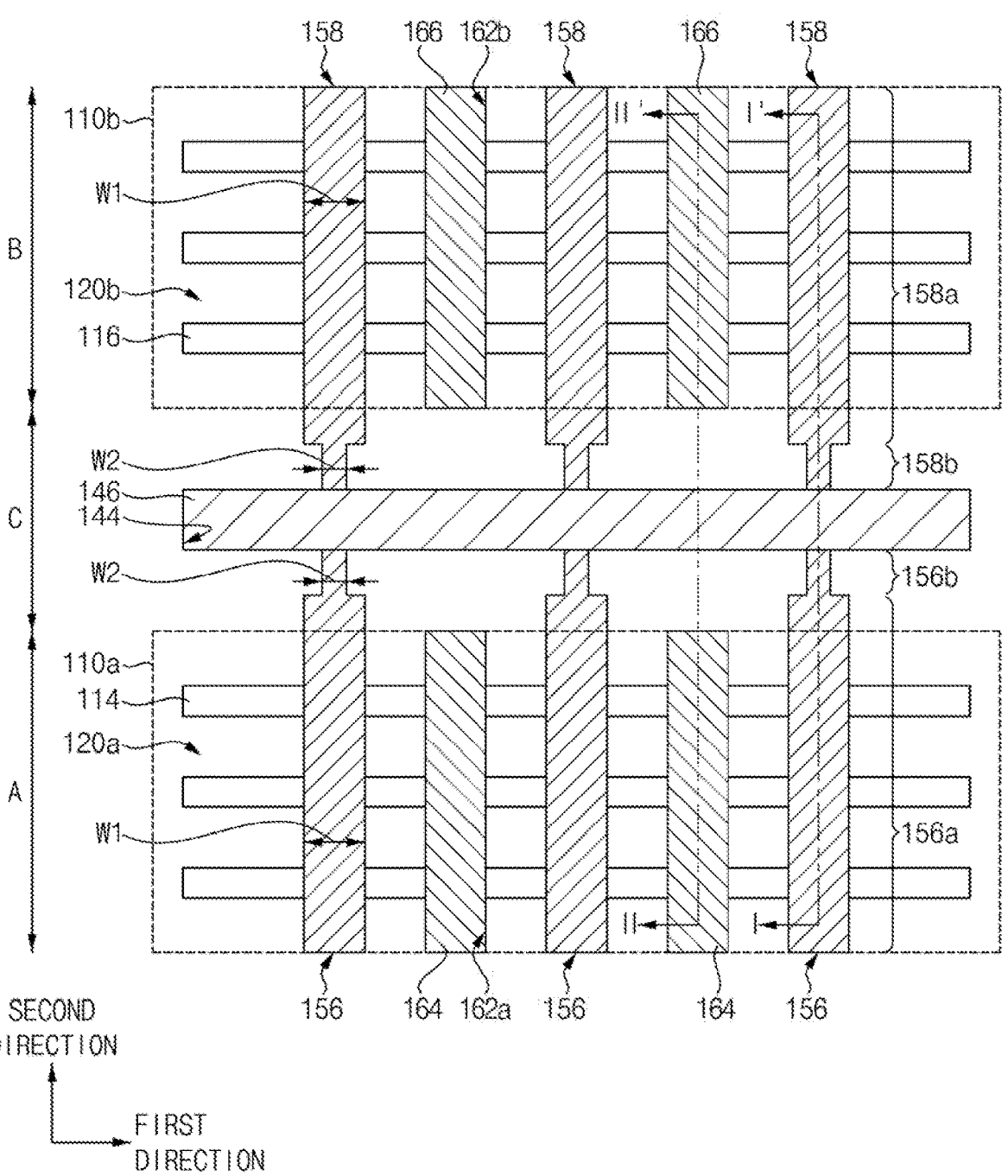
FIG. 1 is a plan view of a semiconductor device in accordance with example embodiments.
Figure 2:
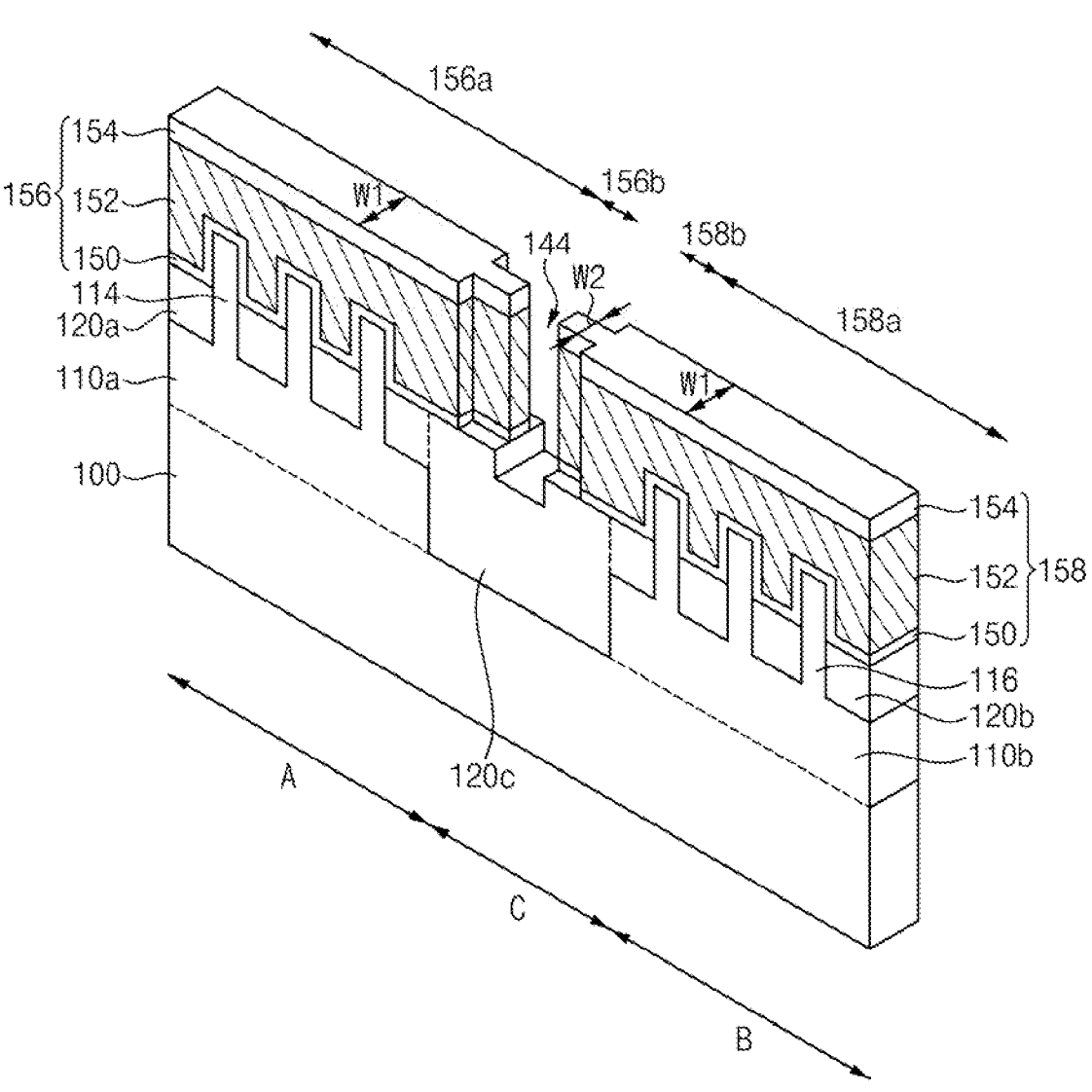
FIG. 2 is a perspective view of a portion of a semiconductor device in accordance with example embodiments.
Figure 3:
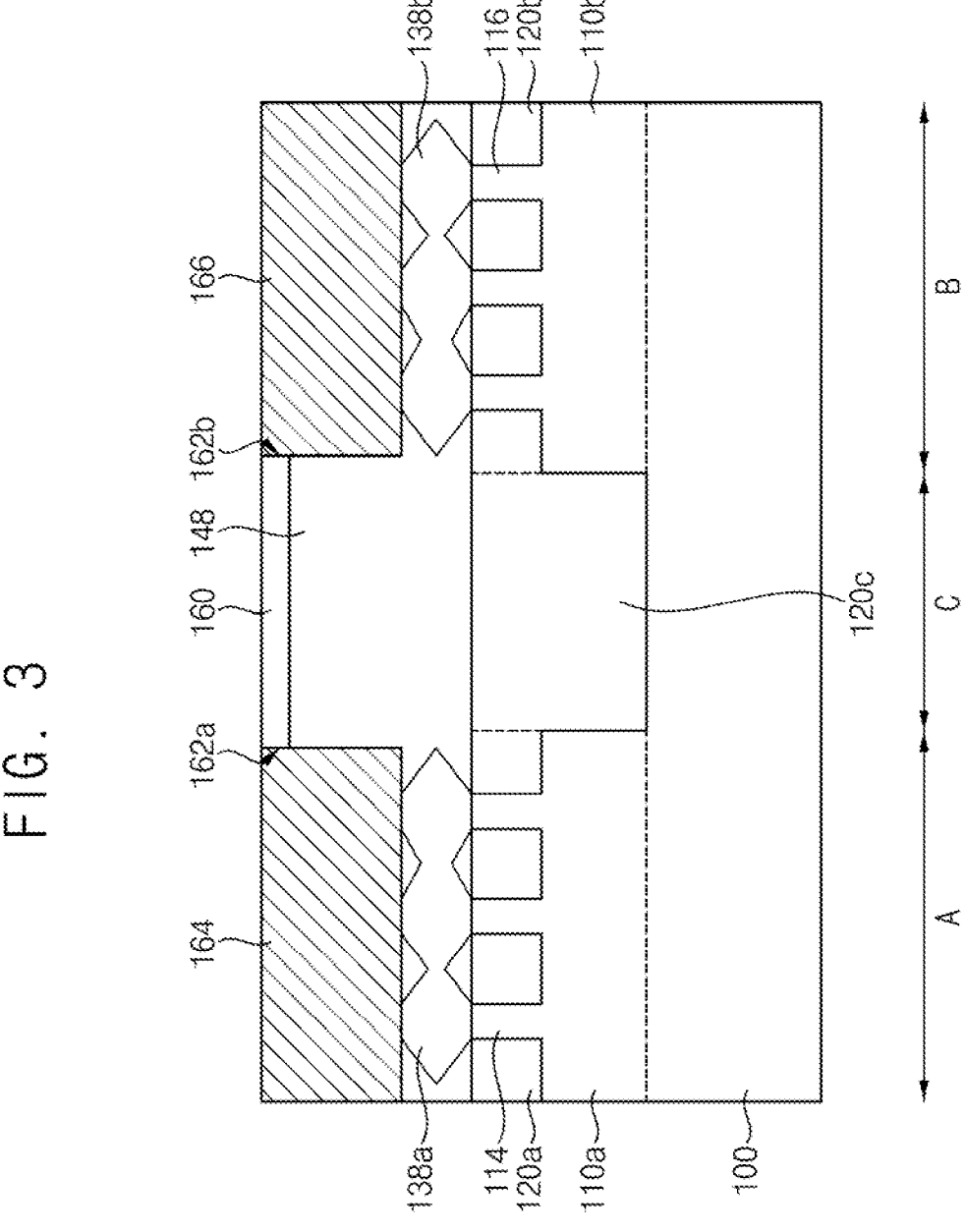
FIG. 3 is a cross-sectional view of a semiconductor device in accordance with example embodiments.

FIG. 1 is a plan view of a semiconductor device in accordance with example embodiments. FIG. 2 is a perspective view of a portion of a semiconductor device in accordance with example embodiments. FIG. 3 is a cross-sectional view of a semiconductor device in accordance with example embodiments.

FIG. 2 shows first and second gate structures. FIG. 3 is a cross-sectional view taken along line II-II' of FIG. 1. FIG. 3 shows a case in which fin FETs are included in the semiconductor device.

Referring to FIGS. 1 to 3, a substrate 100 may include a first region A, a boundary region C, and a second region B. Each of the first region A and the second region B may be a region for forming FETs. An NMOS FET or a PMOS FET may be formed in each of the first region A and the second region B. In an implementation, the first region A may be a region for forming the PMOS FET, and the second region B may be a region for forming the NMOS FET.

Each of the first region A and the second region B may have a shape extending (e.g., lengthwise) in a first direction parallel to an upper surface of the substrate 100, and the boundary region C may be between the first and second regions A and B. The first region A, the boundary region C, and the second region B may be sequentially disposed in a second direction parallel to the upper surface of the substrate 100 and perpendicular to the first direction.

A first active pattern 110a extending in the first direction may be in or on the first region A. First active fins 114 may protrude from an upper surface of the first active pattern 110a, and may extend in the first direction. The first active fins 114 may be spaced apart from each other in the second direction. A first device isolation trench may be between the first active fins 114.

A first isolation pattern 120a may be in the first device isolation trench. The first isolation pattern 120a may partially cover sidewalls of each of the first active fins 114. The first active fins 114 may protrude from or above an upper surface of the first isolation pattern 120a.

A second active pattern 110b extending in the first direction may be in or on the second region B. Second active fins 116 may protrude from an upper surface of the second active pattern 110b, and may extend in the first direction. The second active fins 116 may be spaced apart from each other in the second direction. A second device isolation trench may be between the second active fins 116.

A second isolation pattern 120b may be in the second device isolation trench. The second isolation pattern 120b may partially cover sidewalls of each of the second active fins 116. The second active fins 116 may protrude from or above an upper surface of the second isolation pattern 120b.

A third device isolation trench may be in or on the boundary region C, and the third device isolation trench may have a lower surface that is lower than upper surfaces of the first and second active patterns 110a and 110b. A third isolation pattern 120c may be in the third device isolation trench. The first to third isolation patterns 120a, 120b, and 120c may each include, e.g., silicon oxide.

First gate structures 156 may be on the first active fins 114, the first isolation pattern 120a, and a portion of the third isolation pattern 120c, and may extend in the second direction to cross the first active fins 114. One end of each of the first gate structures 156 may be on the third isolation pattern 120c.

The first gate structure 156 may include a first portion 156a having a first width W1 (e.g., in the first direction) and a second portion 156b having a second width W2 that is less than the first width W1. The first portion 156a of the first gate structure may be on the first active fins 114, the first isolation pattern 120a, and a portion of the third isolation pattern 120c adjacent to the first isolation pattern 120a.

The first portion 156a of the first gate structure may cross the first active fins 114 on the first region A, and may extend onto a portion of the boundary region C. The second portion 156b of the first gate structure may be connected to (e.g., continuous with) one end of the first portion 156a, and may be on the third isolation pattern 120c. In an implementation, the second portion 156b of the first gate structure may not be operated as an actual gate of a FET. Thus, electrical characteristics of the FET may not change even if the width of the second portion 156b is decreased. A contact portion between the first portion 156a and the second portion 156b in the first gate structure may be on the third isolation pattern 120c. One end of the first portion 156a of the first gate structure may be on the boundary region C. As such, the first gate structure 156 may have different widths depending on positions thereof.

In an implementation, both sides of the first portion 156a of the first gate structure in the first direction and both sides of the second portion 156b of the first gate structure in the first direction may not be aligned to or with each other in the second direction. In an implementation, the second portion 156b of the first gate structure may be bent from, e.g., may be stepwise inwardly recessed relative to, the both sides of the first portion 156a of the first gate structure, so that the width of the second portion 156b of the first gate structure may be decreased.

Second gate structures 158 may be on the second active fins 116, the second isolation pattern 120b, and a portion of the third isolation pattern 120c, and may extend in the second direction to cross the second active fins 116. One end of each of the second gate structures 158 may be on the third isolation pattern 120c.

The second gate structure 158 may include a third portion 158a having the first width W1 (e.g., in the first direction) and a fourth portion 158b having the second width W2. The third portion 158a of the second gate structure may be on the second active fins 116, the second isolation pattern 120b, and a portion of the third isolation pattern 120c adjacent to the second isolation pattern 120b.

The third portion 158a of the second gate structure may extend onto a portion of the boundary region C, and may cross the second active fins 116 on the second region B. The fourth portion 158b of the second gate structure may be connected to one end of the third portion 158a, and may be on the third isolation pattern 120c. In an implementation, the fourth portion 158b of the second gate structure may not be operated as an actual gate of a FET. In an implementation, electrical characteristics of the FET may not change even if the width of the fourth portion 158b may be decreased. A contact portion between the third portion 158a and the fourth portion 158b in the second gate structure may be on the third isolation pattern 120c. One end of the third portion 158a of the second gate structure may be on the boundary region C. In an implementation, the second gate structure 158 may have different widths depending on positions thereof.

In an implementation, both sides of the third portion 158a of the second gate structure in the first direction and both sides of the fourth portion 158b of the second gate structure in the first direction may not be aligned to or with each other in the second direction. In an implementation, the fourth portion 158b of the second gate structure may be bent from or at both sides of the third portion 158a of the second gate structure, so that the width of the fourth portion 158b of the second gate structure may be decreased.

One gate structure extending in the second direction may cut at the third isolation pattern 120c and separated into two gate structures to form the first and second gate structures 156 and 158. In an implementation, the first and second gate structures 156 and 158 may be aligned in or along the second direction.

A first opening 144, extending in the first direction, may be between the first gate structure 156 and the second gate structure 158 (which may be aligned along the second direction). The third isolation pattern 120c may be exposed by or at a bottom surface of the first opening 144. The first opening 144 may be a cutting portion between the first and second gate structures 156 and 158. An insulation pattern 146 may be in the first opening 144. The insulation pattern 146 may extend in the first direction. A bottom surface of the insulation pattern 146 may (e.g., directly) contact the third isolation pattern 120c. One end of the first gate structure 156 and one end of the second gate structure 158 facing to each other in the second direction may contact the sidewalls of the insulation pattern 146, respectively.

A plurality of first gate structures 156 may be spaced apart from each other in the first direction. A plurality of second gate structures 158 may be spaced apart from each other in the first direction.

In an implementation, each of the first and second gate structures 156 and 158 may include a gate insulation layer 150, a gate pattern 152, and an upper capping pattern 154. The gate insulation layer 150 may include a high-k layer. The gate insulation layer 150 may include, e.g., metal oxide. The gate pattern 152 may include a metal. The upper capping pattern 154 may include, e.g., silicon nitride.

A first semiconductor pattern may be on the first active fin 114 adjacent to both sides of the first gate structure 156. The first semiconductor pattern may be formed by an epitaxial process. The first semiconductor pattern may serve as an impurity region of an FET, and thus impurities may be doped into the first semiconductor pattern.

In an implementation, the first semiconductor pattern may serve as a source/drain region of a PMOS FET. In this case, the first semiconductor pattern may be doped with P-type impurities. In an implementation, the first semiconductor pattern may include, e.g., silicon germanium. In a cross sectional view, the first semiconductor pattern may have a polygonal shape in which a center portion of a sidewall of the first semiconductor pattern protrudes.

In an implementation, protruding center portions of adjacent first semiconductor patterns (e.g., in the second direction) may contact each other, and thus the first semiconductor patterns may be connected to each other in the second direction. In an implementation, the first semiconductor patterns may serve as one first semiconductor structure 138a. A plurality of first active fins 114 under the first semiconductor structure 138a may be electrically connected by the first semiconductor structure 138a.

A second semiconductor pattern may be on the second active fin 116 adjacent to both sides of the second gate structure 158. The second semiconductor pattern may be formed by an epitaxial process. The second semiconductor pattern may serve as an impurity region of the FET, and the second semiconductor pattern may be doped with impurities.

In an implementation, the second semiconductor pattern may serve as a source/drain region of an NMOS FET. In this case, the second semiconductor pattern may be doped with N-type impurities. In an implementation, the second semiconductor pattern may include, e.g., silicon. In cross sectional view, the second semiconductor pattern may have a polygonal shape in which a center portion of a sidewall of the second semiconductor pattern may protrude.

In an implementation, protruding center portions of adjacent second semiconductor patterns may contact each other in the second direction, and thus the second semiconductor patterns may be connected to each other in the second direction. In an implementation, the second semiconductor patterns may serve as one second semiconductor structure 138b. A plurality of second active fins 116 under the second semiconductor structure 138b may be electrically connected by the second semiconductor structure 138b.

A first insulating interlayer 148 may cover the first semiconductor structure 138a and the second semiconductor structure 138b. A second insulating interlayer 160 may be on the first insulating interlayer 148, and may cover the first and second gate structures 156 and 158.

A first metal pattern 164 may pass through the first and second insulating interlayers 148 and 160, and may contact an upper surface of the first semiconductor structure 138a. In an implementation, a top surface of the first metal pattern 164 may be coplanar with a top surface of the second insulating interlayer 160.

The first metal pattern 164 may extend in the second direction, and may contact at least a portion of the first semiconductor structure 138a. In an implementation, the first metal pattern 164 may be on the first region A.

A second metal pattern 166 may pass through the first and second insulating interlayers 148 and 160, and may contact an upper surface of the second semiconductor structure 138b. In an implementation, a top surface of the second metal pattern 166 may be coplanar with the top surface of the second insulating interlayer 160.

The second metal pattern 166 may extend in the second direction, and may contact at least a portion of the second semiconductor structure 138b. In an implementation, the second metal pattern 166 may be on the second region B.

The first and second metal patterns 164 and 166 may be aligned in the second direction.

In an implementation, each of the first and second metal patterns 164 and 166 may include tungsten. In an implementation, a barrier metal pattern may be further included on sidewalls and a bottom surface of each of the first and second metal patterns 164 and 166. The barrier metal pattern may include, e.g., titanium, titanium nitride, tantalum, or tantalum nitride. As used herein, the term "or" is not an exclusive term, e.g., "A or B" would include A, B, or A and B.

In an implementation, a third insulating interlayer may be on the second insulating interlayer 160 and the first and second metal patterns 164 and 166. A first contact plug may pass through the third insulating interlayer, the second insulating interlayer 160, and the upper capping pattern 154, and may contact the gate pattern of the first gate structure 156. In an implementation, a second contact plug may pass through the third insulating interlayer, the second insulating interlayer 160 and the upper capping pattern 154, and may contact the gate pattern 152 of the second gate structure 158. In an implementation, a first upper wiring connected to each of the first and second metal patterns 164 and 166 and a second upper wiring connected to each of the first and second contact plugs may be on the third insulating interlayer.

As described above, the second width of the second portion 156b of the first gate structure may be less than the first width W1 of the first portion 156a of the first gate structure. The second width W2 of the fourth portion 158b of the second gate structure may be less than the first width W1 of the third portion 158a of the second gate structure. Therefore, a width of the cutting portion (corresponding to a gap in the second direction) between the first and second gate structures 156 and 158 may be less than each of the first width W1 of first gate structure 156 in the first region A and the first width W1 of the second gate structure 158 in the second region B. Therefore, defects in which the ends of the first and second gate structures are connected to each other without being cut may be decreased.

In an implementation, the semiconductor device may be a fin FET. In an implementation, the semiconductor device may be a multi-bridge channel field effect transistor (MBC-FET).

Figure 4:
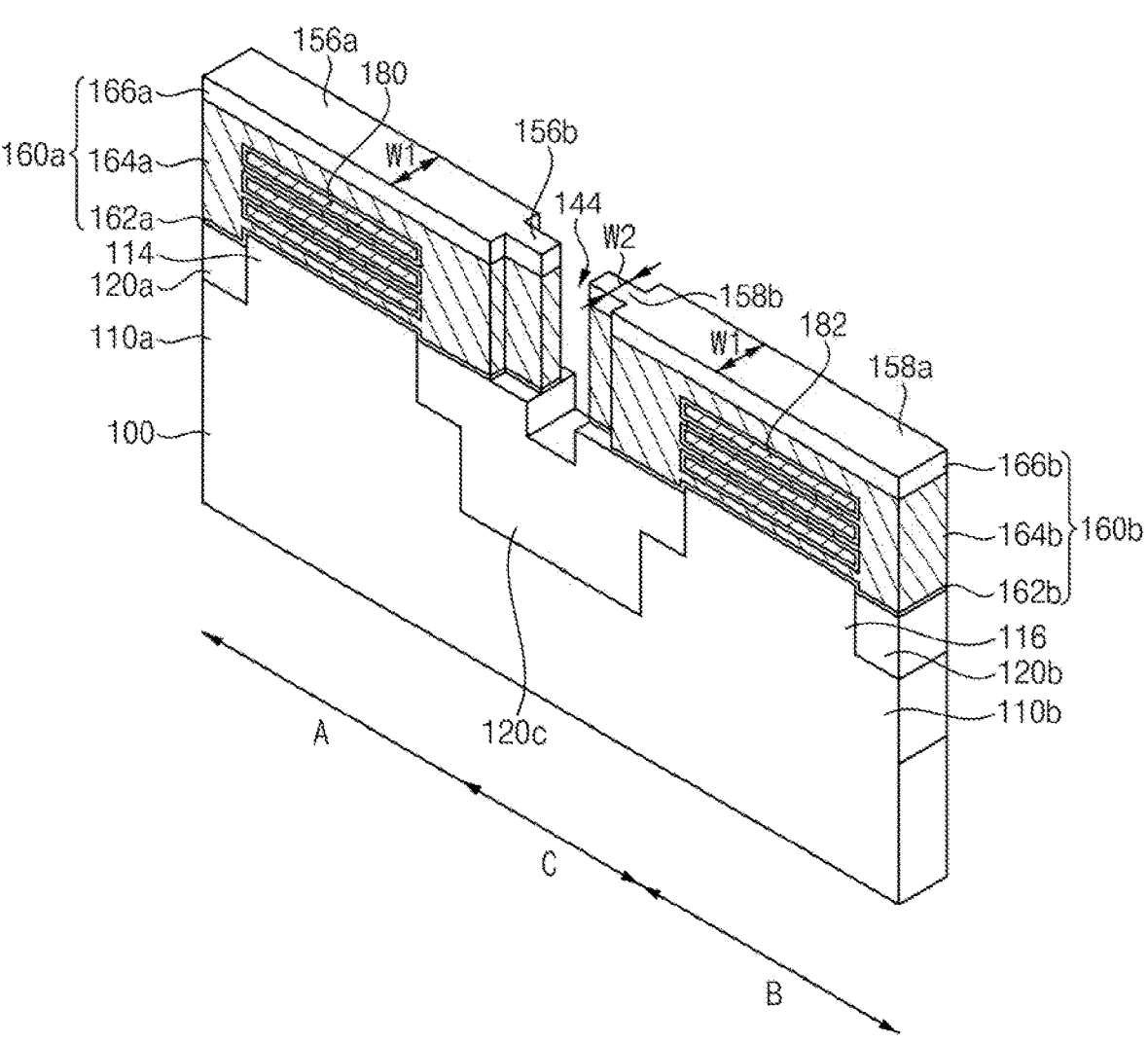
FIG. 4 is a perspective view of a portion of a semiconductor device in accordance with example embodiments.

FIG. 4 is a perspective view of a portion of a semiconductor device in accordance with example embodiments.

FIG. 4 shows a case in which MBC-FETs are included in the semiconductor device. FIG. 4 shows first and second gate structures. The semiconductor device shown in FIG. 4 may be the same as the semiconductor device described with reference to FIGS. 1 to 3, except that a channel region structure may be a nanosheet structure. Therefore, repeated descriptions overlapping those of FIGS. 1 to 3 may be omitted.

Referring to FIG. 4, first nanosheet structures may be on the first region A, and second nanosheet structures may be on the second region (B).

The first nanosheet structure may be at a portion overlapping the first gate structure 156. The first nanosheet structure may include first nanosheets 180 spaced apart from each other in a vertical direction perpendicular to a surface of the substrate 100. In an implementation, the first gate structure 156 may be on the first nanosheet structure and fill gaps between the first nanosheets 180.

The first gate structure 156 may include a first portion 156a having a first width W1 and a second portion 156b having a second width W2 that is less than the first width W1. The first portion 156a of the first gate structure may be on the first nanosheet structures, the first isolation pattern 120a, and the third isolation pattern 120c adjacent to the first isolation pattern 120a. The first portion 156a of the first gate structure may cover the first nanosheet structure on the first region A, and may extend onto a portion of the boundary region C. The second portion 156b of the first gate structure may be connected to one end of the first portion 156a, and may be on the third isolation pattern 120c. In an implementation, a contact portion between the first and second portions 156a and 156b of the first gate structure may be on the third isolation pattern 120c.

A portion of the second nanosheet structure overlapping the second gate structure 158 may include second nanosheets 182 spaced apart from each other in the vertical direction. In an implementation, the second gate structure 158 may be on the second nanosheet structure and fill gaps between the second nanosheets 182.

The second gate structure 158 may include a third portion 158a having the first width W1 and a fourth portion 158b having the second width W2. The third portion 158a of the second gate structure may be on the second nanosheet structures, the second isolation pattern 120b, and the third isolation pattern 120c adjacent to the second isolation pattern 120b. The third portion 158a of the second gate structure may cover the second nanosheet structure on the second region B, and may extend onto a portion of the boundary region C. The fourth portion 158b of the second gate structure may be connected to the third portion 158a, and may be on the third isolation pattern 120c. In an implementation, a contact portion between the third and fourth portions 158a and 158b of the second gate structure may be on the third isolation pattern 120c.

Figure 5:
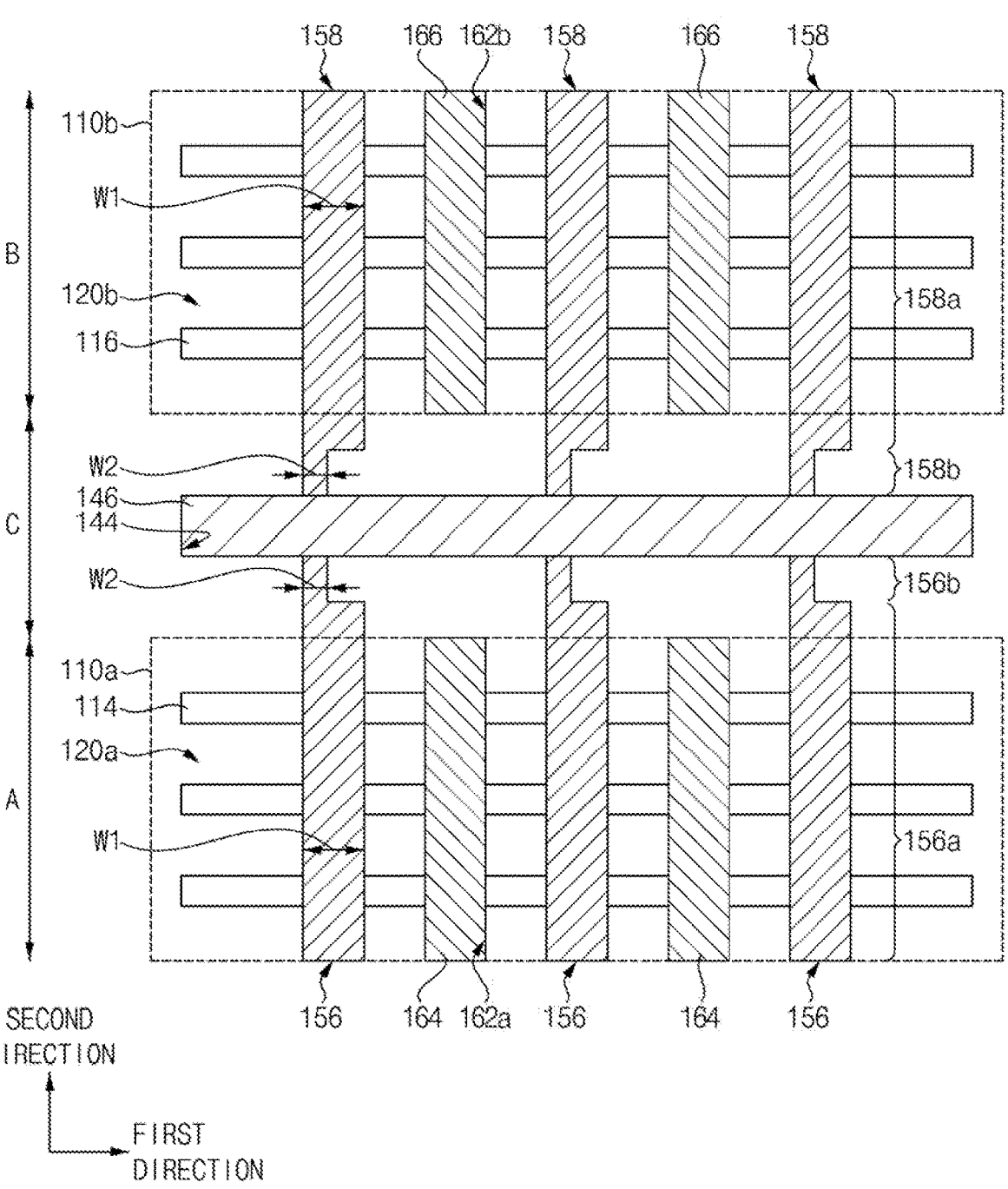
FIG. 5 is a plan view of a semiconductor device in accordance with example embodiments.

FIG. 5 is a plan view of a semiconductor device in accordance with example embodiments.

The semiconductor device shown in FIG. 5 may be the same as the semiconductor device described with reference to FIGS. 1 and 3, except for shapes of the first and second gate structures. Therefore, repeated descriptions overlapping those of FIGS. 1 to 3 may be omitted.

Referring to FIG. 5, a first side of the first portion 156a of the first gate structure 156 may not be aligned with a first side of the second portion 156b of the first gate structure 156 along the second direction. A second side (facing or opposite to the first side of the first portion 156a) of the first gate structure may be aligned with a second side facing the first side of the second portion 156b of the first gate structure along the second direction (e.g., one side of the first gate structure 156 may have a continuous, flat surface from the first portion 156a to the second portion 156b). In an implementation, the first side of the second portion 156b of the first gate structure may be bent from the first side of the first portion 156a of the first gate structure (e.g., recessed in a stepwise manner), so that a width of the second portion 156b of the first gate structure may be decreased.

A first side of the third portion 158a of the second gate structure 158 may not be aligned with a first side of the fourth portion 158b of the second gate structure in the second direction. A second side (facing or opposite, e.g., parallel to the first side of the third portion 158a) of the second gate structure 158 may be aligned with a second side of the fourth portion 158b of the second gate structure 158 in the second direction. In an implementation, the first side of the fourth portion 158b of the second gate structure may be bent from the first side of third portion 158a of the second gate structure, so that a width of the fourth portion 158b of the second gate structure may be decreased.

FIGS. 6 to 16 are plan views and cross-sectional views of stages in a method of manufacturing a semiconductor device in accordance with example embodiments.

Figure 10:
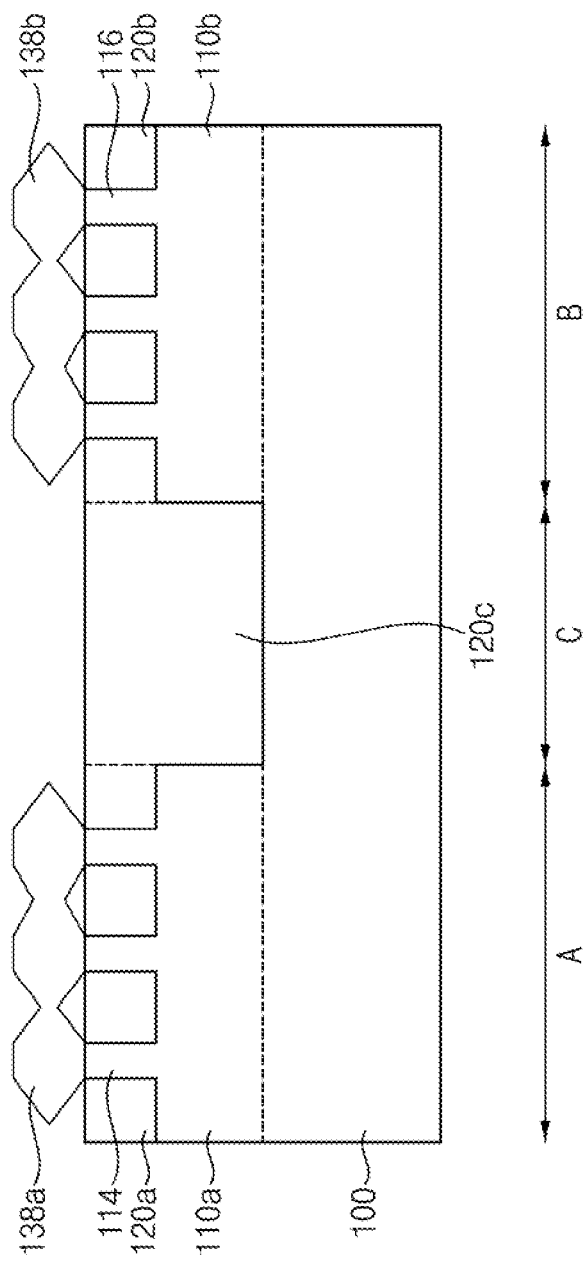

FIGS. 6, 8, 11, 13 and 15 are plan views, and FIGS. 7, 9, 10, 12, 14 and 16 are cross-sectional views. FIGS. 7, 9, 12, and 14 are cross-sectional views taken along line I-I' in FIG. 1, and FIGS. 10 and 16 are cross-sectional views taken along line in FIG. 1.

Figure 6:
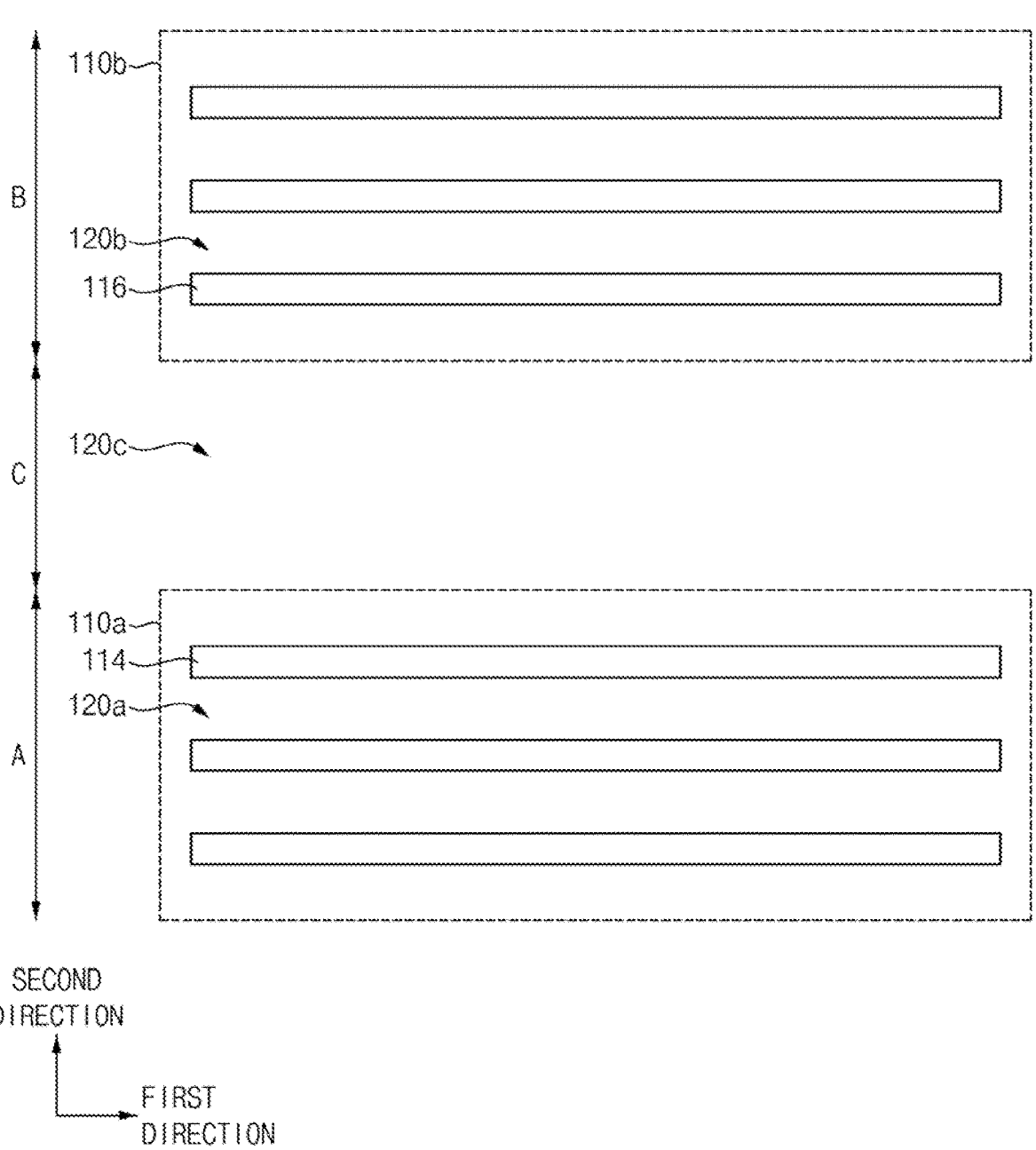
Figure 7:
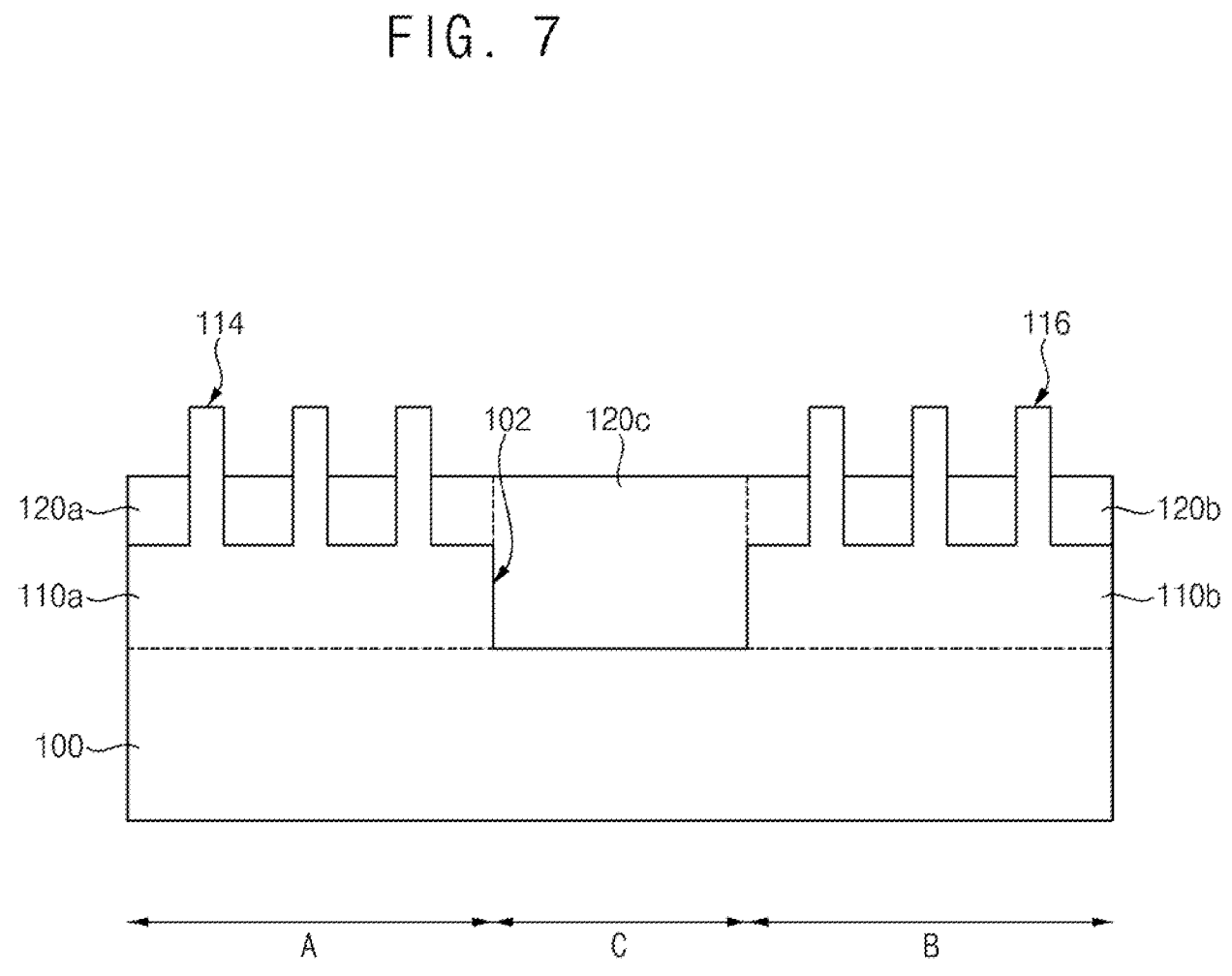

Referring to FIGS. 6 and 7, a substrate 100 including a first region A, a boundary region C, and a second region B may be partially etched to form preliminary active fins extending in the first direction. The preliminary active fins and the substrate 100 in the boundary region C may be further etched to form a third device isolation trench 102.

In an implementation, a first active pattern 110a extending in the first direction may be formed on the substrate 100 on the first region A. Further, first active fins 114 extending in the first direction may be formed on the first active pattern 110a, and may protrude from an upper surface of the first active pattern 110a. A first device isolation trench may be formed between the first active fins 114.

A second active pattern 110b extending in the first direction may be formed on the substrate 100 on the second region B. Second active fins 116 extending in the first direction may be formed on the second active pattern 110b, and may protrude from an upper surface of the second active pattern 110b. A second device isolation trench may be formed between the second active fins 116.

First to third isolation patterns 120a, 120b, and 120c may be formed in the first to third device isolation trenches, respectively. The first isolation pattern 120a may partially cover sidewalls of the first active fins 114. The second isolation pattern 120b may partially cover sidewalls of the second active fins 116. The third isolation pattern 120c may fill the third device isolation trench 102.

The first and second active fins 114 and 116 may protrude from or above upper surfaces of the first and second isolation patterns 120a and 120b, respectively. The first to third isolation patterns 120a, 120b, and 120c may include, e.g., silicon oxide.

Figure 8:
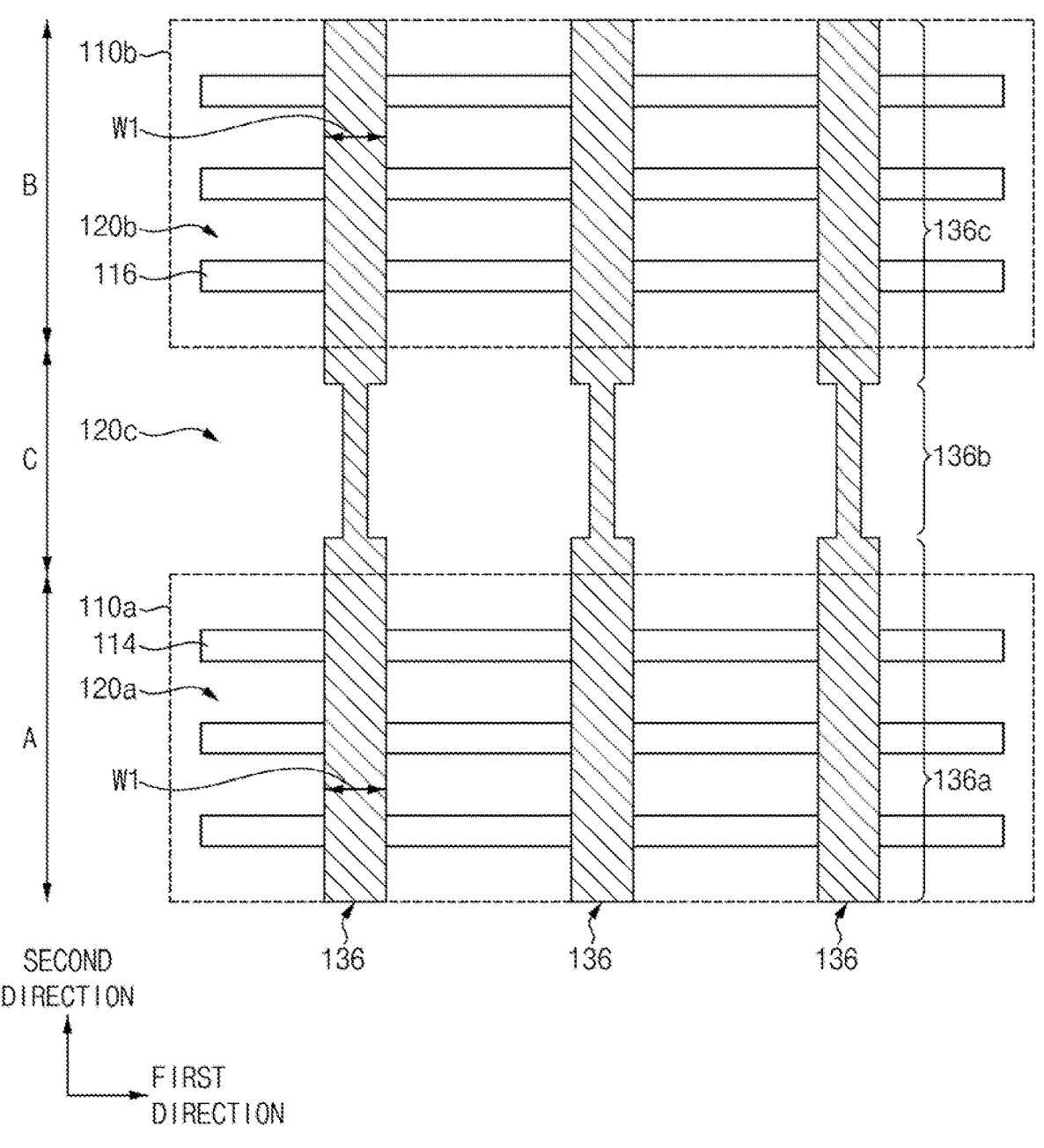

Referring to FIGS. 8 and 9, preliminary dummy gate structures 136 may be formed on the first and second active fins 114 and 116 and the first to third isolation patterns 120a, 120b, and 120c. The preliminary dummy gate structure 136 may extend in the second direction to cross the first and second active fins 114 and 116. The preliminary dummy gate structures 136 may be spaced apart from each other at regular intervals in the first direction. Spacers may be further formed on sidewalls of the preliminary dummy gate structures 136.

In an implementation, the preliminary dummy gate structure 136 may include a first portion 136a having a first width W1, a second portion 136b having a second width W2 less than the first width W1, and a third portion 136c having the first width W1. The first portion 136a of the preliminary dummy gate structure may be formed on the first active fins 114, the first isolation pattern 120a, and the third isolation pattern 120c adjacent to first isolation pattern 120a. The third portion 136c of the preliminary dummy gate structure may be formed on the second active fins 116, the second isolation pattern 120b, and the third isolation pattern 120c adjacent to the second isolation pattern 120b. The second portion 136b of the preliminary dummy gate structure may be connected to the first portion 136a and the third portion 136c, and may be on the third isolation pattern 120c.

In an implementation, a contact portion between the first portion 136a and the second portion 136b of the preliminary dummy gate structure and a contact portion between the second portion 136b and the third portion 136c of the preliminary dummy gate structure may be on the third isolation pattern 120c. One end of the first portion 136a of the preliminary dummy gate structure and one end of the third portion 136c of the preliminary dummy gate structure may be on the third isolation pattern 120c, respectively. In an implementation, the preliminary dummy gate structure 136 may have different widths depending on positions thereof.

In an implementation, the preliminary dummy gate structure 136 may include a dummy gate insulation layer 130, a dummy gate pattern 132 and a dummy capping pattern 134. The dummy gate insulation layer 130 may include, e.g., silicon oxide, the dummy gate pattern 132 may include, e.g., polysilicon, and the dummy capping pattern 134 may include, e.g., silicon nitride.

Referring to FIG. 10, the first active fins 114 adjacent to both sides of the preliminary dummy gate structure 136 may be partially etched to form a first recess. A selective epitaxial growth (SEG) process may be performed form a bottom of the first recess to form a first semiconductor pattern filling the first recess. In an implementation, the first semiconductor pattern may include silicon germanium. The first semiconductor pattern may be doped with p-type impurities.

In a cross sectional view, the first semiconductor pattern may have a polygonal shape in which a center portion of a sidewall of the first semiconductor pattern protrudes. The protruding center portions of adjacent first semiconductor patterns may contact each other in the second direction, and thus the first semiconductor patterns may be connected to each other in the second direction. In an implementation, the first semiconductor patterns may serve as one first semiconductor structure 138a.

In an implementation, the second active fins 116 adjacent to both sides of the preliminary dummy gate structure 136 may be partially etched to form a second recess. A selective epitaxial growth (SEG) process may be performed form a bottom of the second recess to form a second semiconductor pattern filling the second recess. In an implementation, the second semiconductor pattern may include silicon. The second semiconductor pattern may be doped with n-type impurities.

In a cross sectional view, the second semiconductor pattern may have a polygonal shape in which a center portion of a sidewall of the second semiconductor pattern protrudes. The protruding center portions of adjacent second semiconductor patterns may contact each other in the second direction, and thus the second semiconductor patterns may be connected to each other in the second direction. In an implementation, the second semiconductor patterns may serve as one second semiconductor structure 138b.

Figure 11:
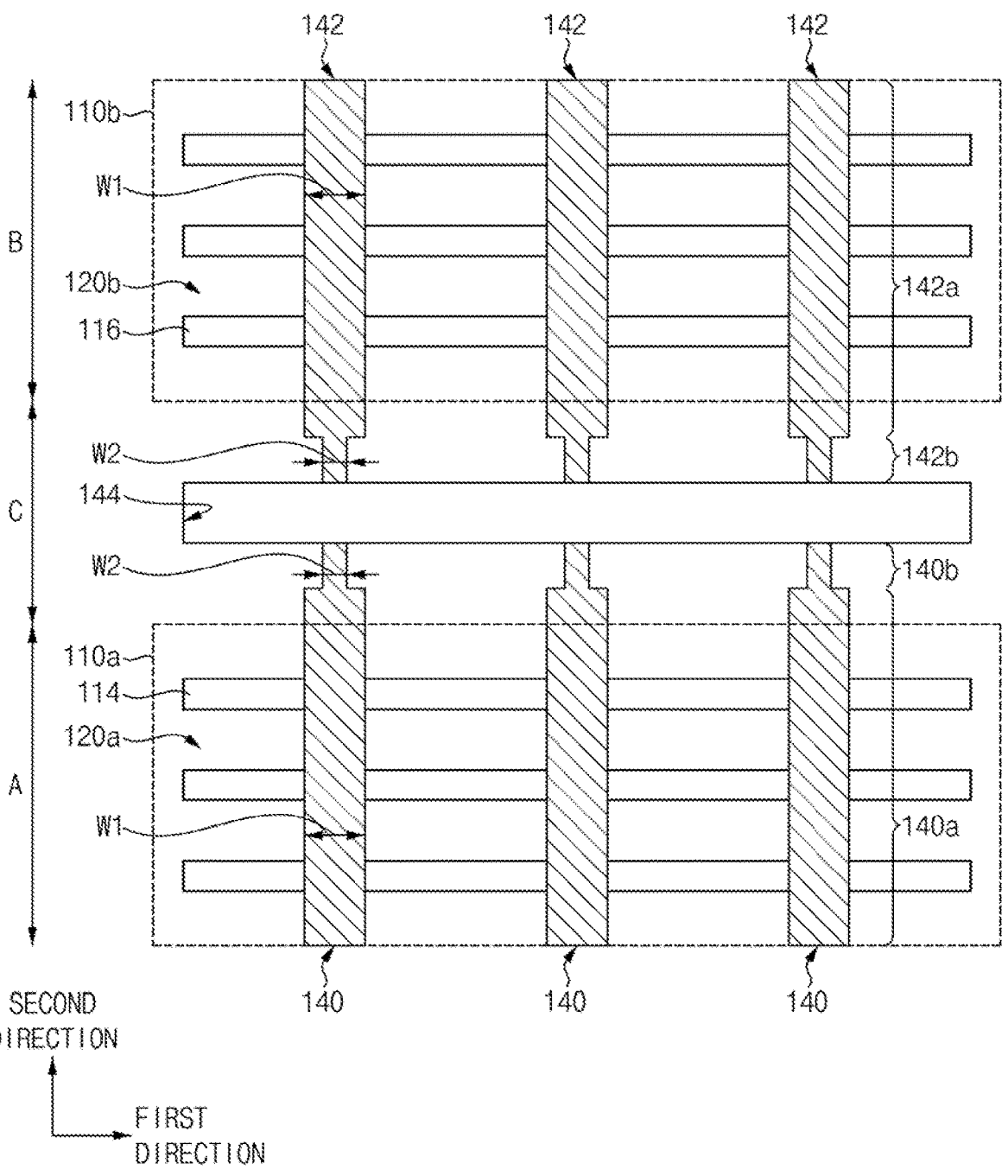
Figure 12:
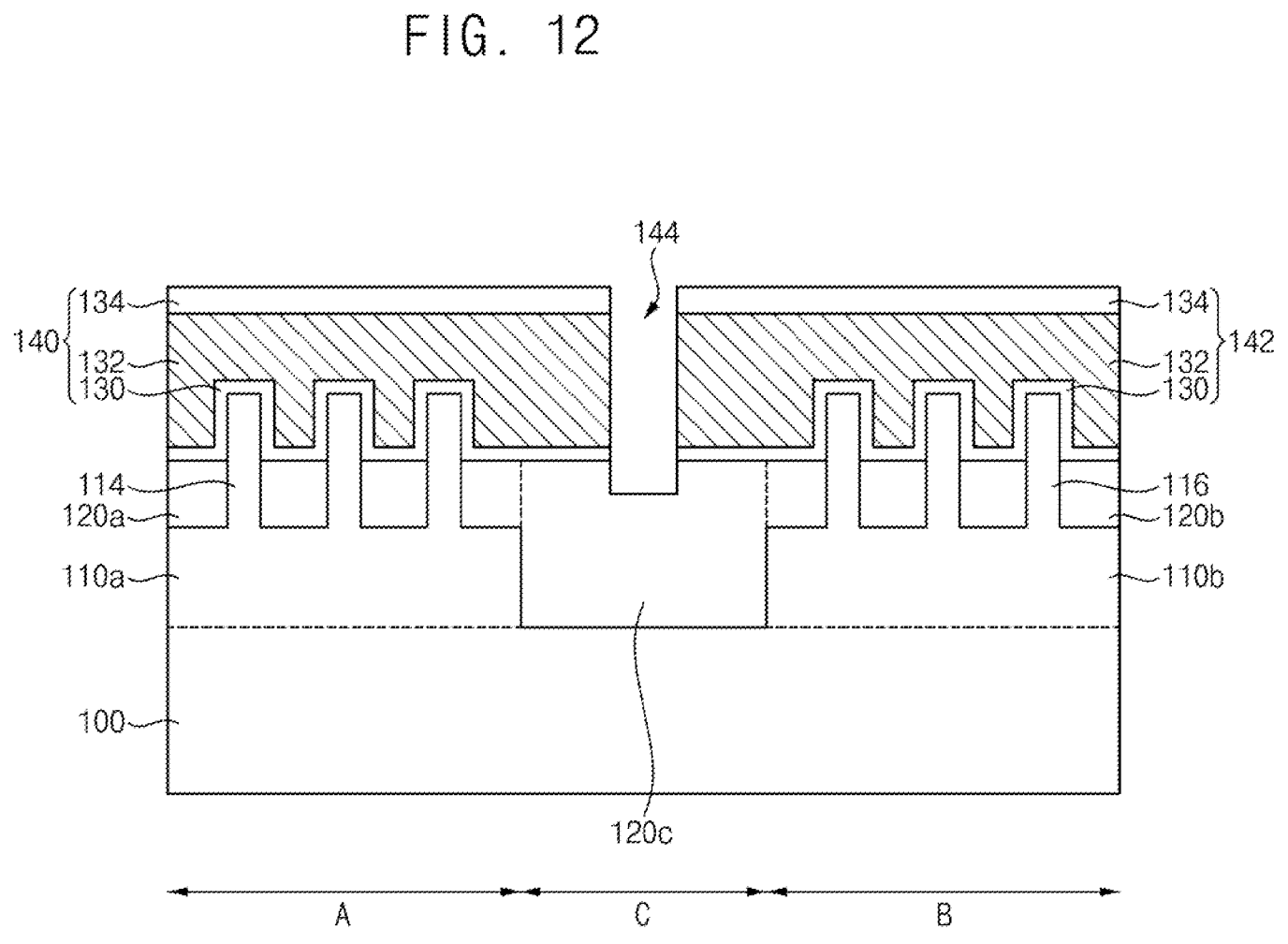

Referring to FIGS. 11 and 12, a first insulating interlayer may be formed on the preliminary dummy gate structure 136 and the first and second semiconductor structures 138a and 138b. The first insulating interlayer may cover the preliminary dummy gate structure 136 and the first and second semiconductor structures 138a and 138b. Thereafter, the first insulating interlayer may be planarized until an upper surface of the preliminary dummy gate structure 136 is exposed.

The preliminary dummy gate structure 136 on the boundary region C may be cut to form a first dummy gate structure 140 and a second dummy gate structure 142. A first opening 144 may be formed at a cutting portion of the preliminary dummy gate structure 136, and the first opening 144 may extend in the first direction.

The first dummy gate structure 140 may include a first portion 140a having the first width W1 and a second portion 140b having the second width W2. The first portion 140a of the first dummy gate structure may be on the first active fins 114, the first isolation pattern 120a, and the third isolation pattern 120c adjacent to the first isolation pattern 120a. The second portion 140b of the first dummy gate structure may be connected to the first portion 140a, and may on the third isolation pattern 120c.

The second dummy gate structure 142 may include a third portion 142a having the first width W1 and a fourth portion 142b having the second width W2. The third portion 142a of the second dummy gate structure may be on the second active fins 116, the second isolation pattern 120b, and the third isolation pattern 120c adjacent to the second isolation pattern 120b. The fourth portion 142b of the second dummy gate structure may be connected to the third portion 142a, and may be on the third isolation pattern 120c.

In the etching process for forming the first opening 144, the preliminary dummy gate structure 136 may be completely cut. If the width of the preliminary dummy gate structure 136 in the first direction were to be great, completely cutting of the preliminary dummy gate structure 136 could be difficult. If the preliminary dummy gate structure 136 were not completely etched and cut, a bridge defect in which first and second gate structures are electrically connected to each other could occur in subsequent processes.

In an implementation, the width of the preliminary dummy gate structure 136 on the boundary region C (e.g., spaced apart from the first and second regions A and B) may be less than the width of the preliminary dummy gate structure 136 on the first and second regions A and B. In an implementation, the width of a cutting portion of the preliminary dummy gate structure 136 may be relatively decreased or lower, and defects in which the preliminary dummy gate structure 136 is not cut may be decreased.

Figure 13:
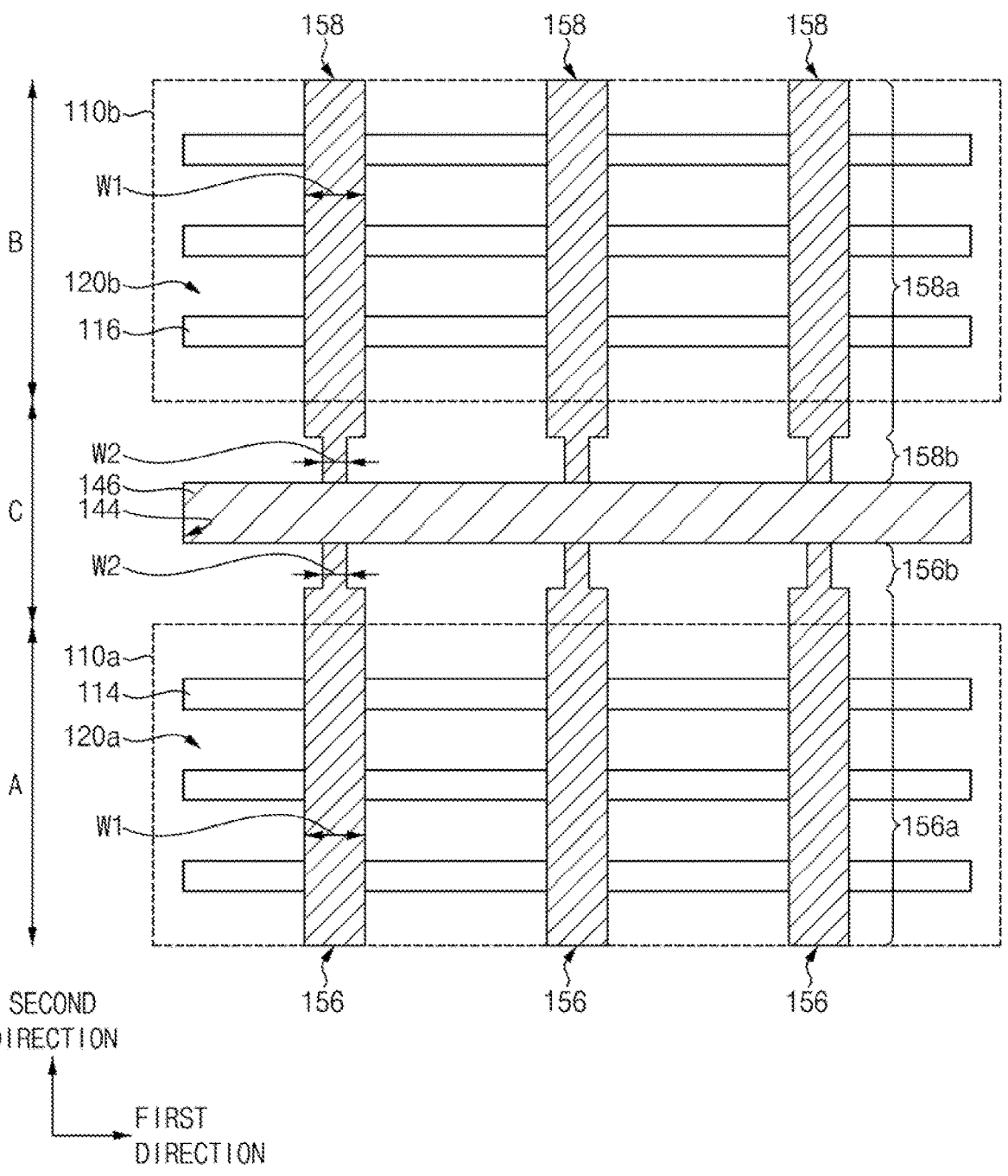
Figure 14:
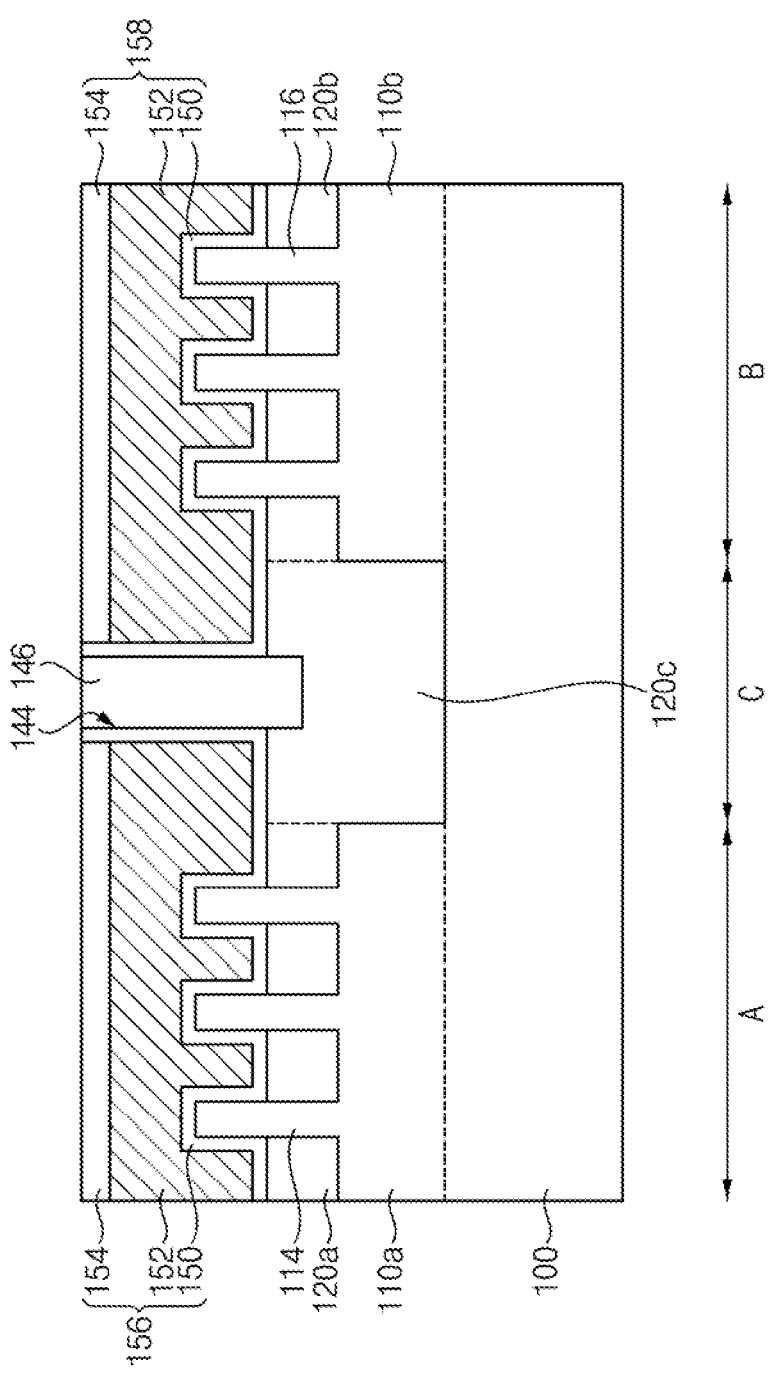

Referring to FIGS. 13 and 14, an insulation layer may be formed to fill the first opening 144. The insulation layer may be planarized until upper surfaces of the first and second dummy gate structures 140 and 142 are exposed to form an insulation pattern 146 filling the first opening 144.

The first and second dummy gate structures 140 and 142 may be removed to form first and second trenches. The first and second gate structures 156 and 158 may be formed in the first and second trenches, respectively.

The first and second gate structures 156 and 158 may have shapes the same as shapes of the first and second dummy gate structures 140 and 142, respectively.

The first gate structure 156 may include a first portion 156a having the first width W1 and a second portion 156b having the second width W2. The first portion 156a of the first gate structure may be on the first active fins 114, the first isolation pattern 120a, and the third isolation pattern 120c adjacent to the first isolation pattern 120a. The second portion 156b of the first gate structure may be connected to the first portion 156a of the first gate structure, and may be on the third isolation pattern 120c. In an implementation, a contact portion between the first portion 156a and the second portion 156b of the first gate structure may be on the third isolation pattern 120c. In an implementation, the first gate structure 156 may have different widths depending on positions thereof.

The second gate structure 158 may include a third portion 158a having the first width W1 and a fourth portion 158b having the second width W2. The third portion 158a of the second gate structure may be on the second active fins 116, the second isolation pattern 120b and the third isolation pattern 120c adjacent to the second isolation pattern 120b. The fourth portion 158b of the second gate structure may be connected to the third portion 158a of the second gate structure, and may be on the third isolation pattern 120c. In an implementation, a contact portion between the third portion 158a and the fourth portion 158b of the second gate structure may be on the third isolation pattern 120c. In an implementation, the second gate structure 158 may have different widths depending on positions thereof.

Figure 15:
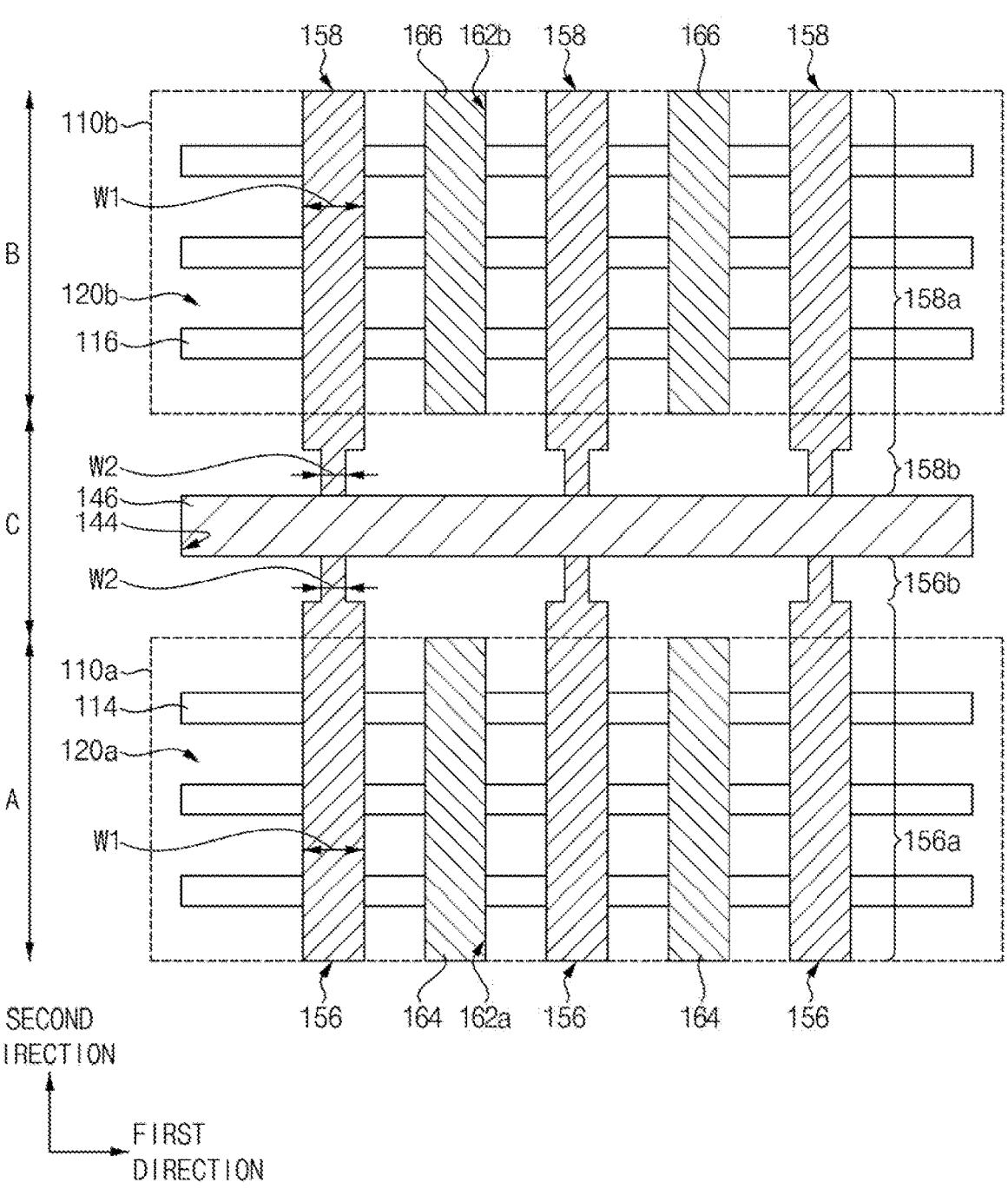

Referring to FIGS. 15 and 16, a second insulating interlayer 160 may be formed on the first gate structure 156, the second gate structure 158 and the first insulating interlayer 148.

The second insulating interlayer 160 and the first insulating interlayer 148 may be etched to form a second opening 162a and a third opening 162b, respectively.

The second opening 162a may expose the first semiconductor structure 138a in the first region A. The second opening 162a may extend in the second direction, and thus a longitudinal direction of the second opening 162a may be the second direction. In an implementation, the second opening 162a may be on the first region A.

The third opening 162b may expose the second semiconductor structure 138b on the second region B. The third opening 162b may extend in the second direction, and may be aligned with the second opening 162a in the second direction. A longitudinal direction of the third opening 162b may be the second direction. In an implementation, the third opening 162b may be on the second region B.

A first metal layer may be formed on the second insulating interlayer 160 to fill the second and third openings 162a and 162b. The first metal layer may include, e.g., tungsten. Thereafter, the first metal layer may be planarized until an upper surface of the second insulating interlayer 160 may be exposed to form a first metal pattern 164 filling the second opening 162a and a second metal pattern 166 filling the third openings 162b. Top surfaces of the first and second metal patterns 164 and 166 may be coplanar with each other.

Thereafter, a third insulating interlayer may be formed to cover the second insulating interlayer and the first and second metal patterns 164 and 166. In an implementation, a first contact plug may be formed through the insulating interlayers to be electrically connected to the gate pattern of the first gate structure. A second contact plug may be formed through the insulating interlayers to be electrically connected to the gate pattern of the second gate structure. In an implementation, upper wirings connected to each of the first and second metal patterns 164 and 166 and the first and second contact plugs may be further formed on the first and second metal patterns and the first and second contact plugs.

As described above, the semiconductor device shown in FIGS. 1 to 3 may be manufactured.

Figure 17:
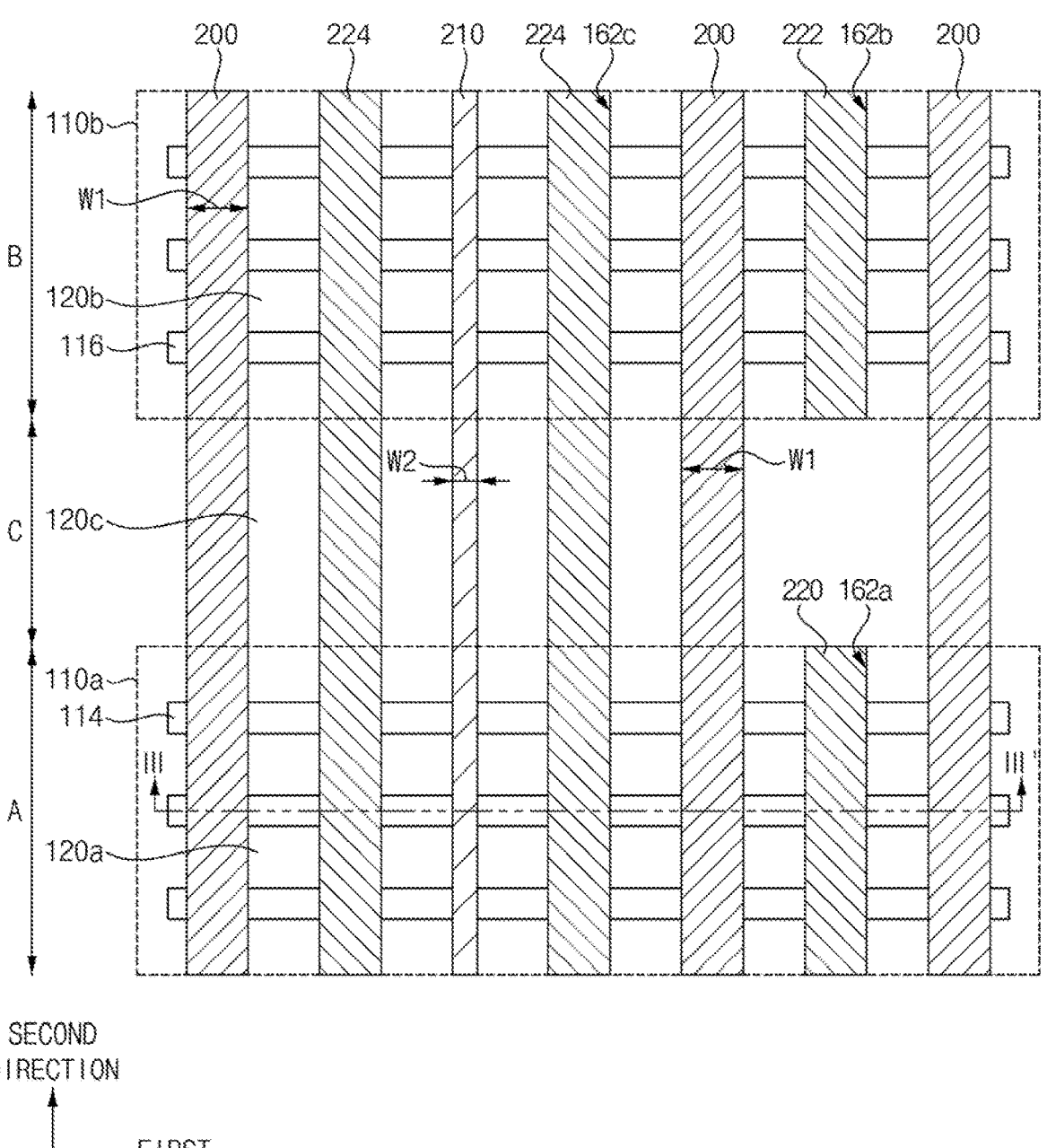
FIG. 17 is a plan view of a semiconductor device in accordance with example embodiments.
Figure 18:
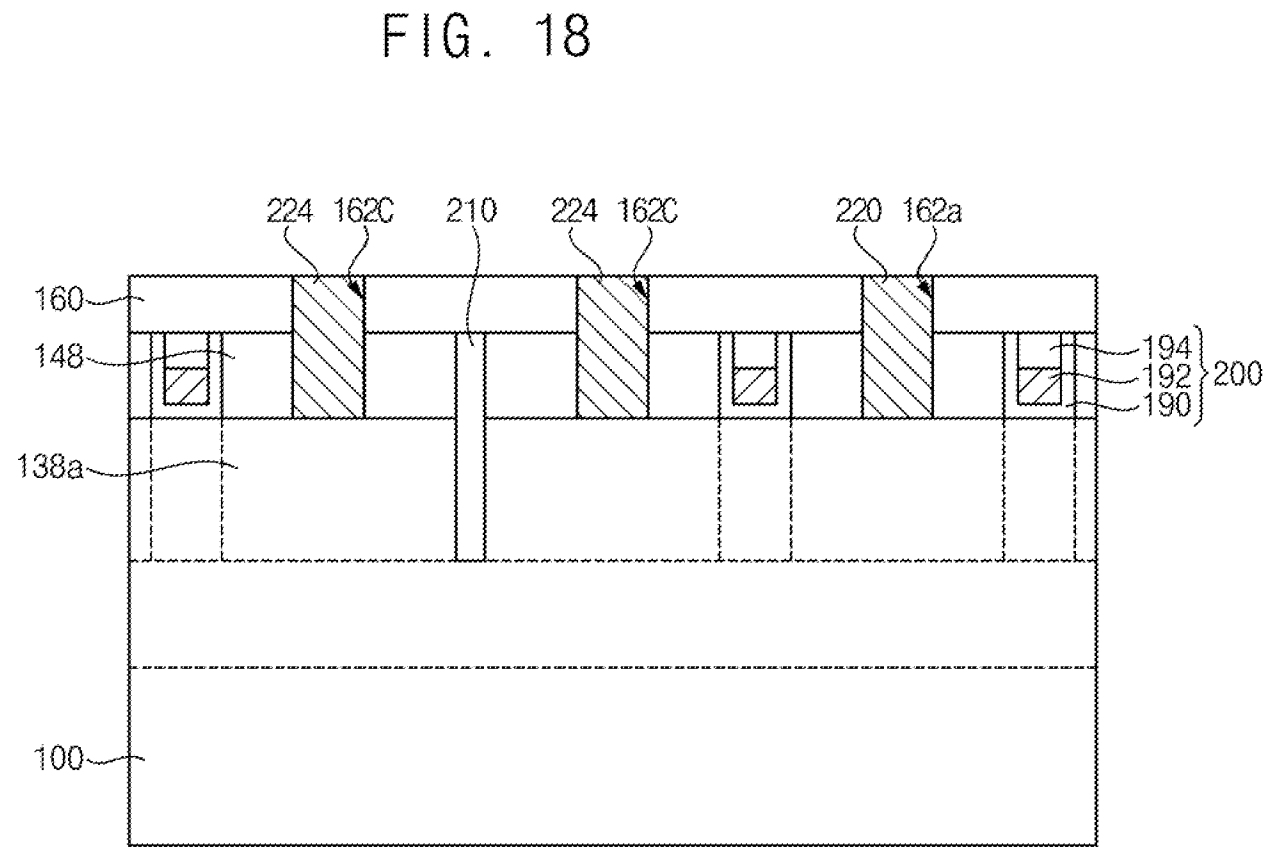

FIG. 17 is a plan view of a semiconductor device in accordance with example embodiments. FIG. 18 is a cross-sectional view of a semiconductor device in accordance with example embodiments.

FIG. 18 is a cross-sectional view taken along line of FIG. 17.

Referring to FIGS. 17 and 18, the substrate 100 may include the first region A, the boundary region C, and the second region B.

The first active pattern 110a may be on the first region A, and the first active fins 114 and the first isolation pattern 120a may be on the first active pattern 110a.

The second active pattern 110b may be on the second region B, and the second active fins 116 and the second isolation pattern 120b may be on the second active pattern 110b.

The third region C of the substrate 100 may include a third device isolation trench having a bottom surface lower than top surfaces of the first and second active patterns 110a and 110b. A third isolation pattern 120c may be in the third device isolation trench.

Gate structures 200 may be on the first active fins 114, the first isolation pattern 120a, the third isolation pattern 120c, the second active fins 116, and the second isolation pattern 120b. Each of the gate structures 200 may extend in the second direction so as to cross the first active fins 114, the first isolation pattern 120a, the third isolation pattern 120c, the second active fins 116, and the second isolation pattern 120b. Each of the gate structures 200 may include a gate insulation layer 190, a gate pattern 192, and an upper capping pattern 194.

The gate structure 200 may have a first width W1. The gate structure 200 may have the same width depending on positions thereof.

A diffusion break pattern 210 may be between neighboring gate structures 200 in the first direction. The diffusion break pattern 210 may be in a trench extending in the second direction while cutting the first active fins 114 and the second active fins 116. The diffusion break pattern 210 may include an insulation pattern. The insulation pattern may include, e.g., silicon oxide or silicon nitride.

The diffusion break pattern 210 may be formed by replacing one of preliminary gate structures with the insulation pattern. In an implementation, the diffusion break pattern 210 may be between neighboring gate structures 200.

The diffusion break pattern 210 may have a second width W2 less than the first width W1. The diffusion break patterns 210 may have the same width depending on or regardless of positions thereof (e.g., a uniform width).

A first semiconductor structure 138*a* may be on both sides of the gate structure 200 on the first region A. A second semiconductor structure 138*b* may be on both sides of the gate structure 200 on the second region B.

A first insulating interlayer 148 may cover the first and second semiconductor structures 138*a* and 138*b*. A second insulating interlayer 160 may be on the first insulating interlayer 148 to cover the gate structure 200.

A third metal pattern 224 may pass through the first and second insulating interlayers 148 and 160, and may contact upper surfaces of the first semiconductor structure 138*a* and the second semiconductor structure 138*b*. The third metal pattern 224 may be on the first region A, the second region B, and the boundary region C, and the third metal pattern 224 may extend in the second direction.

A first metal pattern 220 may pass through the first and second insulating interlayers 148 and 160, and the first metal pattern 220 may contact the first semiconductor structure 138*a*. The first metal pattern 220 may be on the first region A, and the first metal pattern 220 may extend in the second direction.

A second metal pattern 222 may pass through the first and second insulating interlayers 148 and 160, and may contact the second semiconductor structure 138*b*. The second metal pattern 222 may be on the second region B, and the second metal pattern 222 may extend in the second direction. In an implementation, the first and second metal patterns 220 and 222 may be aligned with each other in the second direction.

A third insulating interlayer may be on the second insulating interlayer 160 and the first to third metal patterns 220, 222, and 224. A contact plug may pass through the third insulating interlayer, the second insulating interlayer 160, and the upper capping pattern 194, and may contact the gate pattern 192.

In an implementation, the semiconductor device may include the fin FETs. In an implementation, the semiconductor device may include MBC-FETs.

Figure 19:
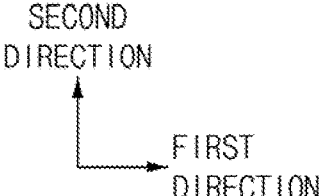
FIGS. 19 to 21 are plan views of stages in a method of manufacturing a semiconductor device in accordance with example embodiments.
Figure 20:
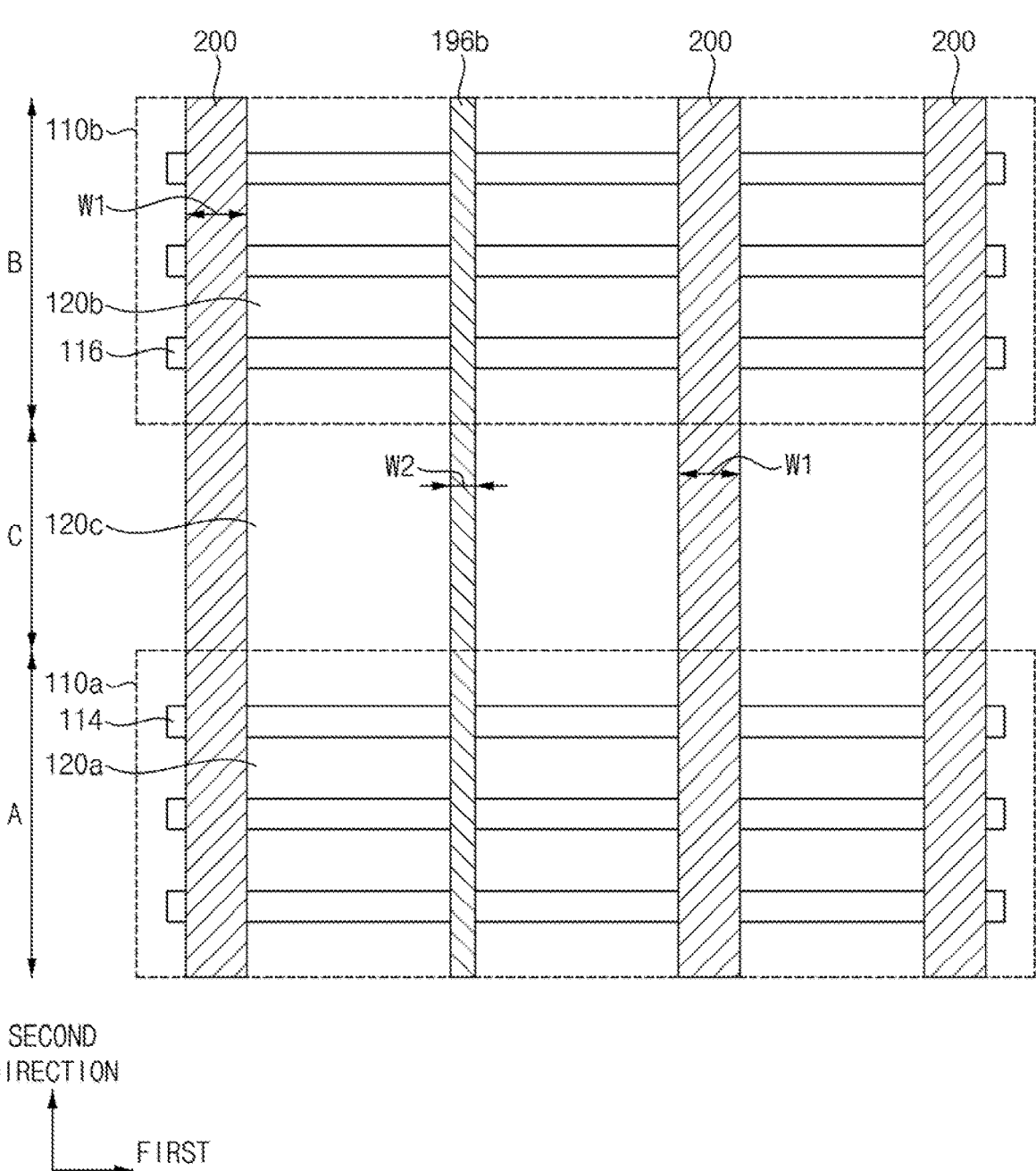
Figure 21:
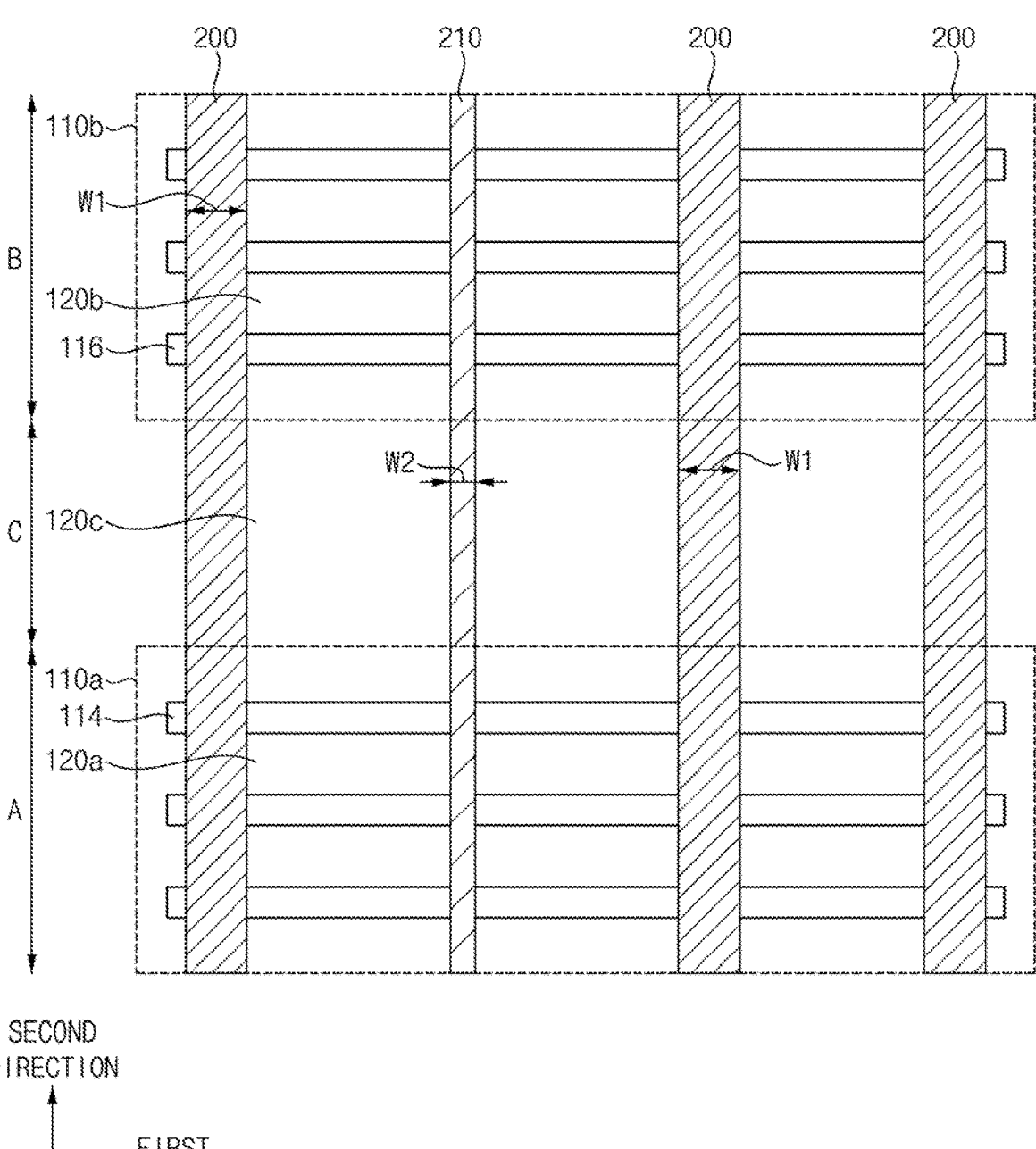

FIGS. 19 to 21 are plan views of stages in a method of manufacturing a semiconductor device in accordance with example embodiments.

First, the processes described with reference to FIGS. 6 and 7 may be performed in the same manner.

Referring to FIG. 19, the first preliminary dummy gate structure 196*a* and the second preliminary dummy gate structure 196*b* may be formed on the first and second active fins 114 and 116 and the first to third isolation patterns 120*a*, 120*b*, and 120*c*.

The first preliminary dummy gate structure 196*a* may be provided as a gate structure by performing subsequent processes. The second preliminary dummy gate structure 196*b* may be provided as a diffusion break pattern by performing subsequent processes. The second preliminary dummy gate structure 196*b* may be between, e.g., two of, the first preliminary dummy gate structures 196*a*.

The first preliminary dummy gate structure 196*a* may have a first width W1. The second preliminary dummy gate structure 196*b* may have a second width W2 that is less than the first width W1. The first preliminary dummy gate structure 196*a* may have the same width depending on positions thereof, and the second preliminary dummy gate structure 196*b* may have the same width depending on positions thereof.

Thereafter, by performing the process described with reference to FIG. 10, a first semiconductor structure may be formed on both sides of the first and second preliminary dummy gate structures 196*a* and 196*b* in the first region, and a second semiconductor structure may be formed on both sides of the first and second preliminary dummy gate structures 196*a* and 196*b* in the second region.

Referring to FIG. 20, the first preliminary dummy gate structure 196*a* may be removed to form a first trench, and a gate structure 200 may be formed in the first trench. The gate structure 200 may have the first width W1.

Referring to FIG. 21, the second preliminary dummy gate structure 196*b* may be removed to form a second trench. During the removing process, the first and second active fins 114 and 116 in the second trench may be removed together. Thereafter, an insulation material may be formed in the second trench, so that a diffusion break pattern 210 may be formed. The diffusion break pattern 210 may have the second width W2. In an implementation, the diffusion break pattern 210 may include, e.g., silicon oxide or silicon nitride.

In an implementation, the diffusion break pattern 210 may be between neighboring gate structures 200. FETs on both sides of the diffusion break pattern 210 may be electrically isolated by the diffusion break pattern 210.

Referring to FIGS. 17 and 18 again, a second insulating interlayer 160 may be formed on the gate structure 200, the diffusion break pattern 210, and the first insulating interlayer 148.

The second insulating interlayer 160 and the first insulating interlayer 148 may be etched to form a second opening 162*a*, a third opening 162*b*, and a fourth opening 162*c*, respectively.

The second opening 162*a* may expose the first semiconductor structure in the first region A. A longitudinal direction of the second opening 162*a* may be the second direction.

The third opening 162*b* may expose the second semiconductor structure in the second region B. The third opening 162*b* may be aligned to the second opening 162*a*, and the third opening 162*b* may extend in the second direction.

The fourth opening 162*c* may expose the first and second semiconductor structures on the first and second regions together. The fourth opening 162*c* may extend in the second direction.

A first metal layer may be on the second insulating interlayer 160 and fill the second to fourth openings 162*a*, 162*b*, and 162*c*. The first metal layer may include, e.g., tungsten. Thereafter, the first metal layer may be planarized until an upper surface of the second insulating interlayer 160 may be exposed to form a first metal pattern 220, a second metal pattern 222 and a third metal pattern 224. The first metal pattern 220 may fill the second opening 162*a*. The second metal pattern 222 may fill the third opening 162*b*, and the third metal pattern 224 may fill the fourth opening 162*c*.

The third metal pattern 224 may be between the gate structure 200 and the diffusion break pattern 210.

The gate structure 200 may include a metal material, and the diffusion break pattern 210 may include an insulation or insulating material. In an implementation, the gate structure 200 and the diffusion break pattern 210 may include different materials, so that a stress may be greatly generated at a region between the gate structure 200 and the diffusion break pattern 210. The third metal pattern 224 between the gate structure 200 and the diffusion break pattern 210 could include defects in which the metal material is broken or the metal material does not completely fill the openings.

However, as described above, as the width of the diffusion break pattern 210 is decreased, the stress between the gate structure 200 and the diffusion break pattern 210 may be decreased. Therefore, defects of the third metal pattern 224 between the gate structure 200 and the diffusion break pattern 210 may be decreased. In an implementation, the diffusion break pattern 210 may not be operated as the FET, and operating characteristics of the semiconductor device may not be affected.

Figure 22:
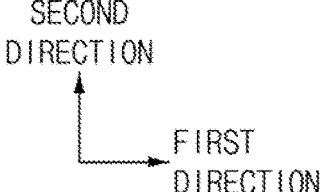
FIG. 22 is a plan view of a semiconductor device in accordance with example embodiments.
Figure 23:
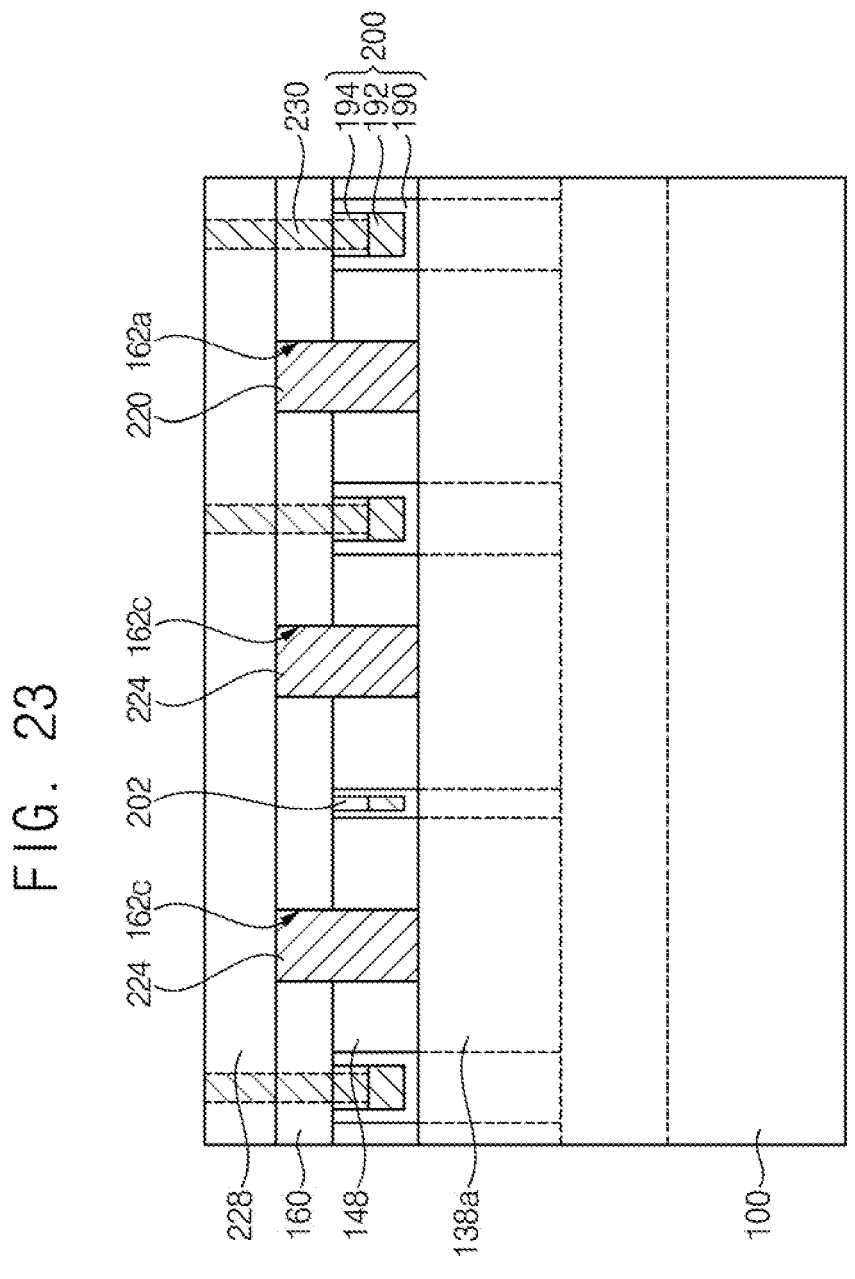
FIG. 23 is a cross-sectional view of a semiconductor device in accordance with example embodiments.

FIG. 22 is a plan view of a semiconductor device in accordance with example embodiments. FIG. 23 is a cross-sectional view of a semiconductor device in accordance with example embodiments.

FIG. 23 is a cross-sectional view taken along line VI-VI' of FIG. 22.

Referring to FIGS. 22 and 23, the substrate 100 may include the first region A, the boundary region C, and the second region B.

The first active pattern 110a may be on the first region A, and the first active fins 114 and the first isolation pattern 120a may be on the first active pattern 110a.

The second active pattern 110b may be on the second region B, and the second active fins 116 and the second isolation pattern 120b may be on the second active pattern 110b.

The third device isolation trench having a bottom surface lower than top surfaces of the first and second active patterns 110a and 110b may be on the third region C of the substrate 100. A third isolation pattern 120c may be in the third device isolation trench.

Gate structures 200 may be on the first active fins 114, the first isolation pattern 120a, the third isolation pattern 120c, the second active fins 116, and the second isolation pattern 120b. The gate structures 200 may extend in the second direction so as to cross the first active fins 114, the first isolation pattern 120a, the third isolation pattern 120c, the second active fins 116, and the second isolation pattern 120b. The gate structures 200 may include a gate insulation layer 190, a gate pattern 192, and an upper capping pattern 194.

The gate structure 200 may have a first width W1. The gate structure 200 may have the same width depending on positions thereof (e.g., a uniform width).

A dummy gate structure 202 may be between neighboring gate structures 200 in the first direction. In an implementation, the dummy gate structure 202 may have a stacked structure the same as a stacked structure of the gate structure 200. In an implementation, the dummy gate structure 202 may have a stacked structure different from that of the gate structure 200.

The dummy gate structure 202 may be on the first active fins 114, the first isolation pattern 120a, the third isolation pattern 120c, the second active fins 116, and the second isolation pattern 120b. The dummy gate structures 202 may extend in the second direction so as to cross the first active fins 114, the first isolation pattern 120a, the third isolation pattern 120c, the second active fins 116, and the second isolation pattern 120b. The dummy gate structure 202 may have a second width W2 that is less than the first width W1. The dummy gate structure 202 may have the same width depending on positions thereof.

A first semiconductor structure 138a may be on both sides of the gate structure 200 on the first region A. A second semiconductor structure 138b may be on both sides of the gate structure 200 on the second region B.

A first insulating interlayer 148 may cover the first semiconductor structure 138a and the second semiconductor structure 138b. A second insulating interlayer 160 may be on the first insulating interlayer 148 to cover the gate structure 200 and the dummy gate structure 202.

A third metal pattern 224 may pass through the first and second insulating interlayer s 148 and 160, and may contact upper surfaces of the first semiconductor structure 138a and the second semiconductor structure. The third metal pattern 224 may extend in the second direction on the first region A, the second region B, and the boundary region C.

A first metal pattern 220 may pass through the first and second insulating interlayers 148 and 160, and may contact the first semiconductor structure 138a. A second metal pattern 222 may pass through the first and second insulating interlayers 148 and 160, and may contact the second semiconductor structure. The first and second metal patterns 220 and 222 may be aligned with each other in the second direction.

A third insulating interlayer 228 may be on the second insulating interlayer 160 and the first to third metal patterns 220, 222, and 224. A contact plug 230 may pass through the third insulating interlayer 228, the second insulating interlayer 160, and the upper capping pattern 194. The contact plug 230 may contact the gate pattern 192. At least one contact plug 230 may be on each of gate structures 200. In an implementation, the contact plug 230 may not be on the dummy gate structure 202.

The semiconductor device may include at least one of the FET having the layouts shown in FIGS. 1, 17 and 22.

Figure 24:
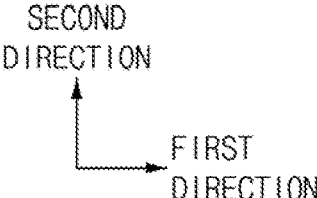
FIGS. 24 to 26 are plan views of stages in a method of manufacturing a semiconductor device in accordance with example embodiments.
Figure 25:
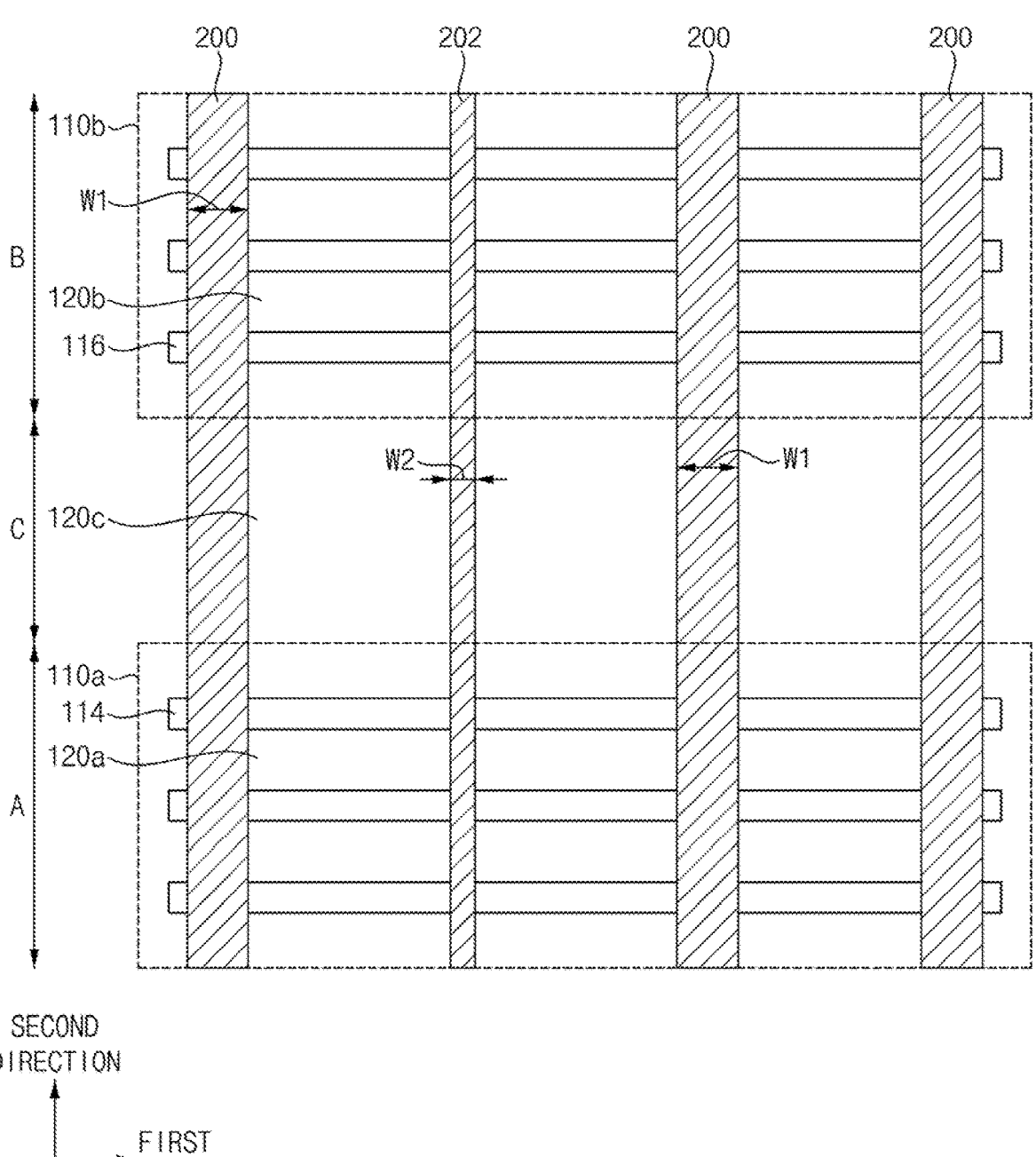
Figure 26:
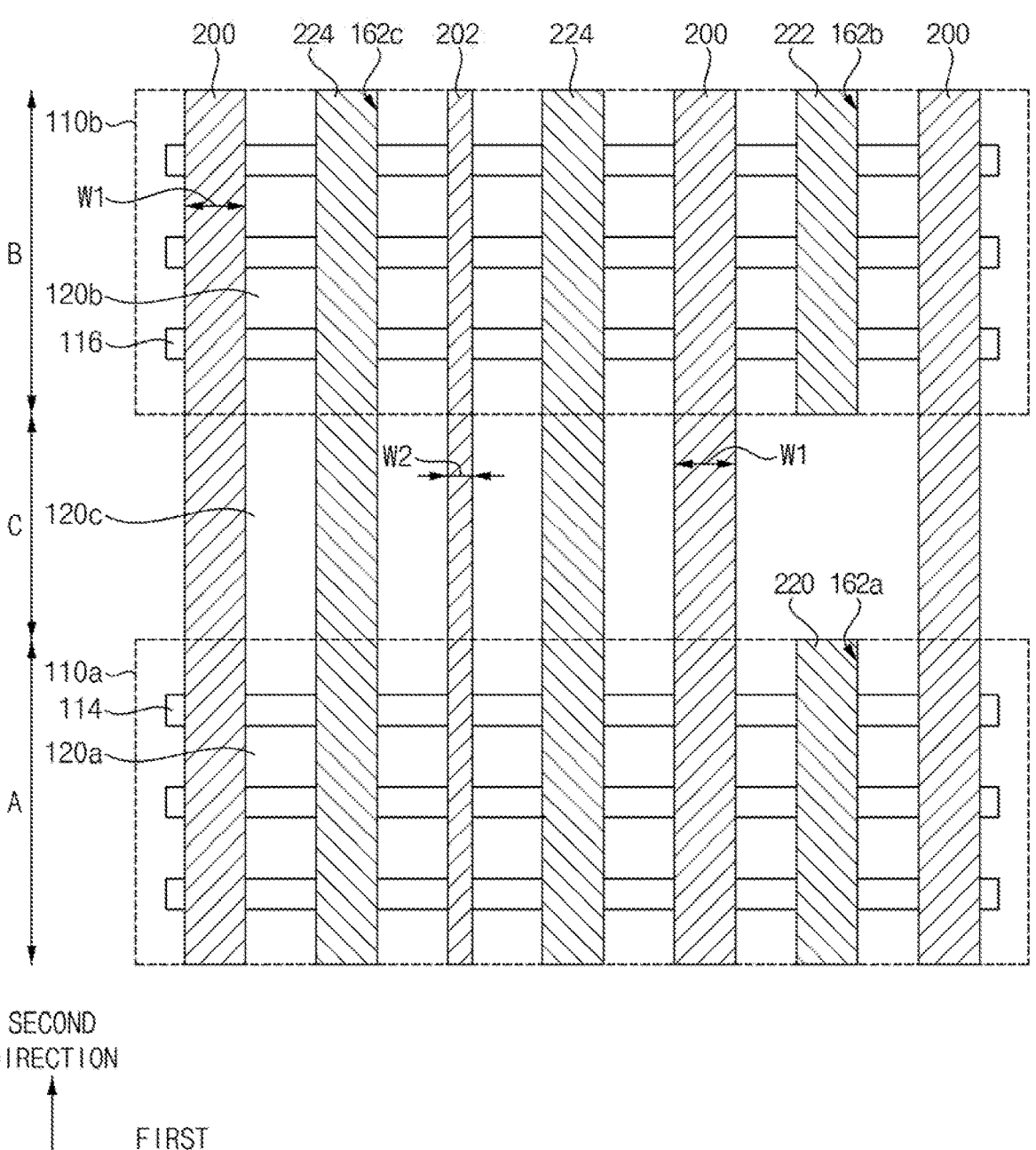

FIGS. 24 to 26 are plan views of stages in a method of manufacturing a semiconductor device in accordance with example embodiments.

First, the processes described with reference to FIGS. 6 and 7 may be performed in the same manner.

Referring to FIG. 24, a first preliminary dummy gate structure 198a and a second preliminary dummy gate structure 198b may be formed on the first and second active fins 114 and 116 and the first to third isolation patterns 120a, 120b, and 120c.

The first preliminary dummy gate structure 198a may be formed as a gate structure by performing subsequent processes. The second preliminary dummy gate structure 198b may be formed as a dummy gate structure by performing subsequent processes. The second preliminary dummy gate structure 198b may be disposed between neighboring first preliminary dummy gate structures 198a.

The first preliminary dummy gate structure 198a may have a first width W1. The second preliminary dummy gate structure 198b may have a second width W2 less than the first width W1. The first preliminary dummy gate structure 198a may have the same width depending on positions thereof. The second preliminary dummy gate structure 198b may have the same width depending on positions thereof.

Thereafter, the process described with reference to FIG. 10 may be performed to form a first semiconductor structure on both sides of the first and second preliminary dummy gate structures 198a and 198b on the first region A, and a second semiconductor structure on both sides of the first and second preliminary dummy gate structures 198a and 198b on the second region B.

Referring to FIG. 25, the first and second preliminary dummy gate structures 198a and 198b may be removed to form a first trench and a second trench, respectively. A gate structure 200 may be formed in the first trench, and a dummy gate structure 202 may be formed in the second trench. The gate structure 200 may have the first width W1. The dummy gate structure 202 may have the second width W2.

The gate structure 200 and the dummy gate structure 202 may have the same stacked structure. Each of the gate structure 200 and the dummy gate structure 202 may include a gate insulation layer 190, a gate pattern 192 and an upper capping pattern 194.

In an implementation, the dummy gate structure 202 may be formed between neighboring gate structures 200. The dummy gate structure 202 may not be actually operated as a FET.

Referring to FIG. 26, a second insulating interlayer 160 may be formed on the gate structure 200, the dummy gate structure 202 and the first insulating interlayer 148.

The second insulating interlayer 160 and the first insulating interlayer 148 may be etched to form a second opening 162a, a third opening 162b, and a fourth opening 162c, respectively.

The second opening 162a may expose the first semiconductor structure 138a on the first region A. A longitudinal direction of the second opening 162a may be the second direction.

The third opening 162b may expose the second semiconductor structure 138b on the second region B. The third opening 162b may be aligned with the second opening 162a in the second direction.

The fourth opening 162c may expose the first and second semiconductor structures 138b on the first region A and the second regions B together. The fourth opening may extend in the second direction.

A first metal layer may be formed on the second insulating interlayer 160 to fill the second to fourth openings 162a, 162b, and 162c. The first metal layer may include, e.g., tungsten. Thereafter, the first metal layer may be planarized until an upper surface of the second insulating interlayer 160 is exposed to form a first metal pattern 220, a second metal pattern 222, and a third metal pattern 224. The first metal pattern 220 may fill the second opening 162a. The second metal pattern 222 may fill the third opening 172b and the third metal pattern 224 may fill the fourth opening 162c.

The third metal pattern 224 may be between the gate structure 200 and the dummy gate structure 202.

If the first width W1 of the gate structure 200 and the dummy gate structure 202 were to increase, a width of a region between the gate structure 200 and the dummy gate structure 202 could be decreased. In this case, forming of the third metal pattern 224 between the gate structure 200 and the dummy gate structure 202 could be difficult. As the width of the region between the gate structure 200 and the dummy gate structure 202 is decreased, the metal material of the third metal pattern 224 could be broken, or the metal material does not completely fill the opening.

In an implementation, as described above, the dummy gate structure 202 may have a second width W2 less than the first width W1, and thus the width of the region between the gate structure 200 and the dummy gate structure 202 may be increased. Therefore, defects of the third metal pattern 224 between the gate structure 200 and the dummy gate structure 202 may be decreased. In an implementation, the dummy gate structure 202 may not actually be operated as a field effect transistor, and operating characteristics of the semiconductor may not be affected.

Referring to FIGS. 22 and 23 again, a third insulating interlayer 228 may be formed on the first to third metal patterns 220, 222 and 224 and the second insulating interlayer 160.

The third insulating interlayer 228, the second insulating interlayer 160, and the upper capping pattern 194 of the gate structure 200 may be etched to form a contact hole exposing the gate pattern 192. A metal layer may be formed on the third insulating interlayer 228 to fill the contact hole. The metal layer may include, e.g., tungsten. Thereafter, the metal layer may be planarized until an upper surface of the third insulating interlayer 228 may be exposed to form a contact plug 230. The contact plug 230 may contact the gate pattern 192 of the gate structure 200. The contact plug 230 may not be formed on the dummy gate structure 202. Therefore, an electrical signal may not be applied to the dummy gate structure 202. The dummy gate structure 202 may not be actually operated as a gate structure of a FET.

By way of summation and review, a semiconductor device may be highly integrated, and FETs may have a complicated arrangement. Further, defects of patterns could occur during patterning processes for forming of the FETs.

One or more embodiments may provide a semiconductor device including FETs.

In example embodiments, in the FETs included in the semiconductor device, end portions facing each other in the second direction of the first and second gate structures may have relatively narrow widths. Therefore, a bridge defect in which the end portions of the first and second gate structures are connected may be decreased.

As described above, connection failures of the semiconductor device may be decreased. Accordingly, the semiconductor device may have desired electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including a first region and a second region;
a first active fin extending in a first direction on the first region of the substrate;
a second active fin extending in the first direction on the second region of the substrate;
an isolation pattern on the substrate between the first region and the second region;
a first gate structure on the first active fin, the first gate structure extending in a second direction perpendicular to the first direction, and the first gate structure extending onto an upper surface of the isolation pattern;
a second gate structure on the second active fin, the second gate structure extending in the second direction, and the second gate structure extending onto the upper surface of the isolation pattern,
wherein a first end in the second direction of the first gate structure and a second end in the second direction of the second gate structure facing the first end are spaced apart from each other in the second direction,
wherein the first gate structure and the second gate structure are physically separated from each other,
wherein the first gate structure includes a first portion having a first width and a second portion having a second width that is less than the first width, wherein the second gate structure includes a third portion having the first width and a fourth portion having the second width, and wherein the second portion includes the first end, and the fourth portion includes the second end.

2. The semiconductor device as claimed in claim 1, wherein:

the second portion of the first gate structure is on the isolation pattern, and the fourth portion of the second gate structure is on the isolation pattern.

3. The semiconductor device as claimed in claim 1, wherein:

the first portion of the first gate structure is on the first active fin and on the isolation pattern adjacent to the first region, and the third portion of the second gate structure is on the second active fin and on the isolation pattern adjacent to the second region.

4. The semiconductor device as claimed in claim 1, wherein the first gate structure and the second gate structure are aligned with each other in the second direction.

5. The semiconductor device as claimed in claim 1, further comprising:

a first semiconductor structure on the first active fin adjacent to both sides of the first gate structure;

a first metal pattern extending in the second direction, the first metal pattern contacting the first semiconductor structure;

a second semiconductor structure on the second active fin adjacent to both sides of the second gate structure; and a second metal pattern extending in the second direction, the second metal pattern contacting the second semiconductor structure.

6. The semiconductor device as claimed in claim 5, wherein:

the first metal pattern is on the first region, and the second metal pattern is on the second region.

7. The semiconductor device as claimed in claim 1, further comprising:

an opening extending in the first direction and being between the first gate structure and the second gate structure in the second direction, and an insulation pattern extending in the first direction and filling the opening.

8. The semiconductor device as claimed in claim 7, wherein a bottom surface of the insulation pattern contacts the isolation pattern.

9. The semiconductor device as claimed in claim 7, wherein the first end of the first gate structure and the second end of the second gate structure contact sidewalls of the insulation pattern, respectively.

10. A semiconductor device, comprising:

a substrate including a first region, a second region, and a boundary region between the first region and the second region;

first active fins on the first region of the substrate, the first active fins extending in a first direction;

second active fins on the second region of the substrate, the second active fins extending in the first direction;

an isolation pattern on the boundary region of the substrate;

first gate structures on the first active fins, the first gate structures extending in a second direction perpendicular to the first direction, and the first gate structures extending onto an upper surface of the isolation pattern;

second gate structures on the second active fins, the second gate structures extending in the second direction, and the second gate structures extending onto the upper surface of the isolation pattern;

a first semiconductor structure on the first active fins adjacent to both sides of each of the first gate structures;

a first metal pattern extending in the second direction, the first metal pattern contacting the first semiconductor structure;

a second semiconductor structure on the second active fins adjacent to both sides of each of the second gate structures; and a second metal pattern extending in the second direction, the second metal pattern contacting the second semiconductor structure, wherein a portion of each of the first gate structures on the isolation pattern has a width that is less than a width of other portion of each of the first gate structures, and wherein a portion of each of the second gate structures on the isolation pattern has a width that is less than a width of other portion of each of the second gate structures.

11. The semiconductor device as claimed in claim 10, wherein:

each of the first gate structures includes a first portion having a first width and a second portion having a second width that is less than the first width, the second portion being on the isolation pattern, and each of the second gate structures includes a third portion having the first width and a fourth portion having the second width, the fourth portion being on the isolation pattern.

12. The semiconductor device as claimed in claim 11, wherein:

the first portion of each of the first gate structures is on the first active fins and on the isolation pattern adjacent to the first region, and the third portion of each of the second gate structures is on the second active fins and on the isolation pattern adjacent to the second region.

13. The semiconductor device as claimed in claim 10, further comprising:

an opening extending in the first direction and being between each of the first gate structures and each of the second gate structures in the second direction; and an insulation pattern extending in the first direction and filling the opening.

14. The semiconductor device as claimed in claim 10, further comprising:

a first isolation pattern between the first active fins; and a second isolation pattern between the second active fins, wherein upper portions of the first active fins protrude from the first isolation pattern, and wherein upper portions of the second active fins protrude from the second isolation pattern.

15. A semiconductor device, comprising:

a substrate including a first region, a second region, and a boundary region between the first region and the second region;

an isolation pattern on the boundary region of the substrate;

a first gate structure on the first region of the substrate, the first gate structure extending in a second direction, and a first end in the second direction of the first gate structure being on the isolation pattern of the boundary region adjacent to the first region; and a second gate structure on the second region of the substrate, the second gate structure extending in the second direction, and a second end in the second direction of the second gate structure being on the isolation pattern of a boundary region adjacent to the second region, wherein the first end and the second end facing the first end are spaced apart from each other in the second direction, wherein the first gate structure and the second gate structure are physically separated from each other, wherein the first gate structure includes a first portion having a first width and a second portion having a second width that is less than the first width, the second portion being on the isolation pattern, wherein the second gate structure includes a third portion having the first width and a fourth portion having the second width, the fourth portion being on the isolation pattern, and wherein the second portion includes the first end, and the fourth portion includes the second end.

16. The semiconductor device as claimed in claim 15, further comprising first active fins on the first region and second active fins on the second region, wherein:

the first portion of the first gate structure is on the first active fins and on the isolation pattern adjacent to the first region, and the third portion of the second gate structure is on the second active fins and on the isolation pattern adjacent to the second region.

17. The semiconductor device as claimed in claim 15, further comprising:

an opening extending in a first direction perpendicular to the second direction and being between the first gate structure and the second gate structure in the second direction, and an insulation pattern extending in the first direction and filling the opening.

18. The semiconductor device as claimed in claim 15, further comprising:

first active fins on the first region of the substrate, the first active fins extending in a first direction perpendicular to the second direction;

second active fins on the second region of the substrate, the second active fins extending in the first direction;

a first semiconductor structure on the first active fins adjacent to both sides of the first gate structure; and a second semiconductor structure on the second active fins adjacent to both sides of the second gate structure, wherein the first active fins are disposed under the first semiconductor structure and the second active fins are disposed under the second semiconductor structure, and wherein the first semiconductor structure includes a source/drain region of a p-type transistor and the second semiconductor structure includes a source/drain region of an n-type transistor.

19. The semiconductor device as claimed in claim 18, further comprising:

a first isolation pattern between the first active fins on the first region of the substrate; and a second isolation pattern between the second active fins on the second region of the substrate.

20. The semiconductor device as claimed in claim 15, further comprising:

a first nanosheet structure on the first region of the substrate, the first nanosheet structure including first nanosheets spaced apart from each other in a vertical direction; and a second nanosheet structure on the second region of the substrate, the second nanosheet structure including second nanosheets spaced apart from each other in the vertical direction.

* * * * *